US011199572B2

(12) United States Patent
Jovanovic et al.

(10) Patent No.: US 11,199,572 B2
(45) Date of Patent: Dec. 14, 2021

(54) ELECTRONICS TESTER

(71) Applicant: Aehr Test Systems, Fremont, CA (US)

(72) Inventors: Jovan Jovanovic, Santa Clara, CA (US); Kenneth W. Deboe, Santa Clara, CA (US); Steven C. Steps, Saratoga, CA (US); Scott E. Lindsey, Brentwood, CA (US)

(73) Assignee: Aehr Test Systems, Fremont, CA (US)

( * ) Notice: Subject to any disclaimer, the term of this patent is extended or adjusted under 35 U.S.C. 154(b) by 34 days.

(21) Appl. No.: 16/831,485

(22) Filed: Mar. 26, 2020

(65) Prior Publication Data

US 2020/0233026 A1    Jul. 23, 2020

Related U.S. Application Data

(62) Division of application No. 15/906,620, filed on Feb. 27, 2018, now Pat. No. 10,649,022.

(60) Provisional application No. 62/466,462, filed on Mar. 3, 2017, provisional application No. 62/526,089, filed on Jun. 28, 2017.

(51) Int. Cl.
| | | |
|---|---|---|
| *G01R 31/20* | (2006.01) | |
| *G01R 31/28* | (2006.01) | |
| *H01L 21/687* | (2006.01) | |
| *H05K 7/14* | (2006.01) | |

(52) U.S. Cl.
CPC ..... *G01R 31/2808* (2013.01); *G01R 31/2893* (2013.01); *H01L 21/687* (2013.01); *H05K 7/1402* (2013.01); *H05K 7/1412* (2013.01); *H05K 7/1417* (2013.01)

(58) Field of Classification Search
CPC ............ G01R 31/2628; G01R 31/2808; G01R 31/2849; G01R 31/2867; G01R 31/2877; G01R 31/2887; G01R 31/2874; G01R 31/2886; G01R 31/2891; G01R 31/2893; G01R 31/2894; G01R 31/2896; G01R 31/0408; G01R 31/0483; G01R 31/0466; G01R 31/0433; G01R 31/2851; G01R 1/07342; G01R 1/06711; G01R 1/06738; G01R 1/06772; G01R 31/31924; G01R 31/3004; G01R 31/2884; G01R 31/31922
See application file for complete search history.

(56) References Cited

U.S. PATENT DOCUMENTS

| | | | |
|---|---|---|---|
| 4,608,679 A | 8/1986 | Rudy et al. | |
| 5,108,302 A | 4/1992 | Pfaff | |
| 6,135,699 A | 10/2000 | Yutaka et al. | |
| 6,137,303 A | 10/2000 | Deckert et al. | |

(Continued)

OTHER PUBLICATIONS

International Search Report and Written Opinion dated Jun. 25, 2018, International PCT Patent Application No. PCT/US2018/019934, (15 pages).

(Continued)

*Primary Examiner* — Thang X Le
(74) *Attorney, Agent, or Firm* — Stephen M. De Klerk

(57) ABSTRACT

A tester apparatus is described. Various components contribute to the functionality of the tester apparatus, including an insertion and removal apparatus, thermal posts, independent gimbaling, the inclusion of a photo detector, a combination of thermal control methods, a detect circuitry in a socket lid, through posts with stand-offs, and a voltage retargeting.

14 Claims, 20 Drawing Sheets

(56) References Cited

U.S. PATENT DOCUMENTS

| | | | |
|---|---|---|---|
| 6,339,321 | B1 | 1/2002 | Yamashita et al. |
| 7,453,260 | B2 | 11/2008 | Boyle et al. |
| 8,974,116 | B2 * | 3/2015 | Okamoto .................. G01K 1/14 374/29 |
| 2003/0057130 | A1 | 3/2003 | Fix et al. |
| 2005/0111944 | A1 | 5/2005 | Aho et al. |
| 2008/0150125 | A1 * | 6/2008 | Braunisch ........... H01L 25/0657 257/712 |
| 2009/0212803 | A1 | 8/2009 | Yamamoto et al. |
| 2011/0273831 | A1 * | 11/2011 | Kyle .................. H01R 12/7076 361/679.31 |
| 2012/0075807 | A1 * | 3/2012 | Refai-Ahmed ..... H01L 25/0652 361/719 |
| 2012/0142210 | A1 | 6/2012 | De Stefano |
| 2015/0204942 | A1 * | 7/2015 | Scocchetti ............ G01R 1/0466 324/750.05 |
| 2016/0103179 | A1 | 4/2016 | Lindsey et al. |
| 2017/0358515 | A1 * | 12/2017 | Murdock ............ H01L 23/3677 |
| 2019/0019711 | A1 | 1/2019 | Tamura |

OTHER PUBLICATIONS

Invitation to Pay Additional Fees dated Apr. 12, 2018, International PCT Patent Application No. PCT/US2018/019934, (3 pages).

* cited by examiner

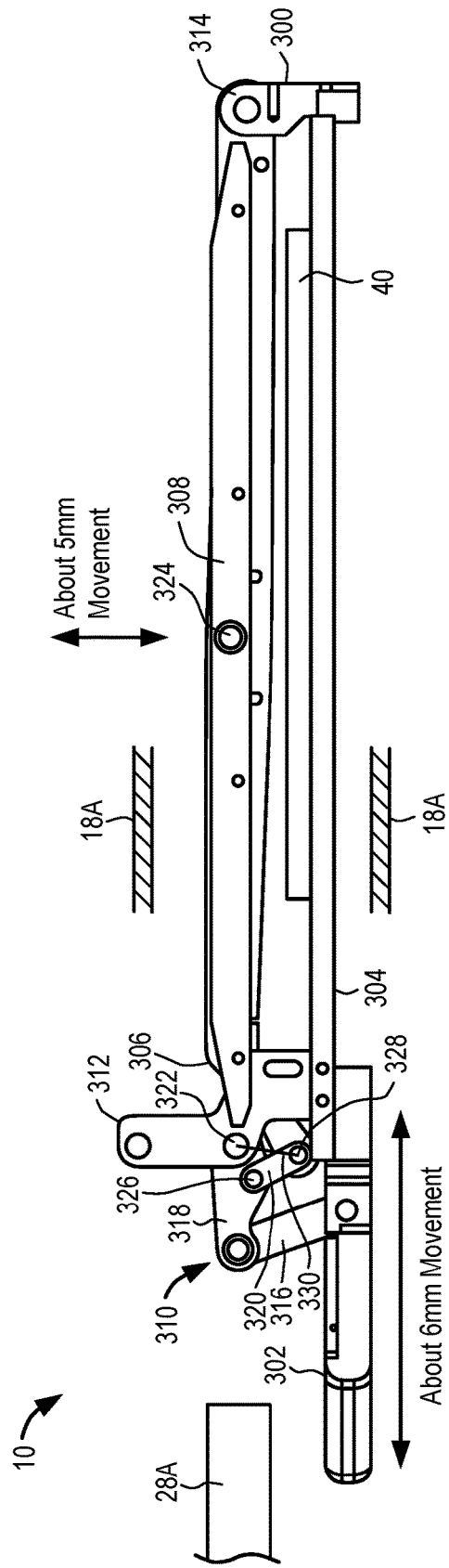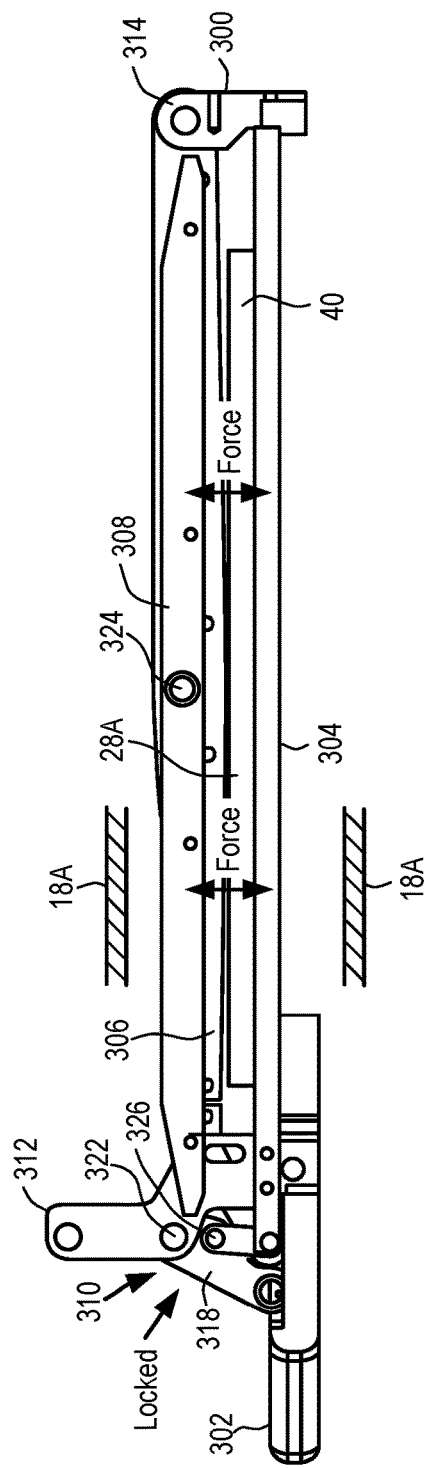
FIG. 9A
FIG. 9B

ELECTRONICS TESTER

CROSS-REFERENCE TO RELATED APPLICATIONS

This application is a divisional of U.S. patent application Ser. No. 15/906,620 filed on Feb. 27, 2018, which claims priority from U.S. Provisional Patent Application No. 62/466,462, filed on Mar. 3, 2017 and U.S. Provisional Patent Application No. 62/526,089, filed on Jun. 28, 2017, which are hereby incorporated by reference into the present application in their entirety.

BACKGROUND OF THE INVENTION

1). Field of the Invention

This invention relates to a tester apparatus that is used for testing microelectronic circuits.

2). Discussion of Related Art

Microelectronic circuits are usually fabricated in and on semiconductor wafers. Such a wafer is subsequently "singulated" or "diced" into individual dies. Such a die is typically mounted to a supporting substrate for purposes of providing rigidity thereto and for electronic communication with an integrated or microelectronic circuit of the die. Final packaging may include encapsulation of the die and the resulting package can then be shipped to a customer.

It is required that the die or the package be tested before being shipped to the customer. Ideally, the die should be tested at an early stage for purposes of identifying defects that occur during early stage manufacture. Wafer level testing may be accomplished by providing a handler and a contactor with contacts and then using the handler to move the wafer so that contacts on the wafer make contact with the contacts on the contactor. Power and electronic signals can then be provided through the contactor to and from microelectronic circuits formed in the wafer.

According to various embodiments a wafer includes a substrate such as a silicon substrate or a printed circuit board and one or more devices fabricated in the substrate or mounted to the substrate.

Alternatively, the wafer can be located within a portable cartridge having an electrical interface and a thermal chuck. Power and signals can be provided through the electric interface to and from the wafer while a temperature of the wafer is thermally controlled by heating or cooling the thermal chuck.

After the wafer is singulated it may again be required to test the individual dies, and it may again be required to test the die after it is mounted to a supporting substrate.

SUMMARY OF THE INVENTION

The invention provides a testing apparatus including a frame, a slot assembly on the frame, a slot assembly interface on the slot assembly, a holding structure to place a cartridge holding a plurality of microelectronic devices, a horizontal transportation apparatus operable to move the cartridge horizontally from a first position to a second position into the slot assembly, a vertical transportation apparatus operable to move the cartridge and the slot assembly in a first vertical direction relative to one another to engage the slot assembly interface with a cartridge interface on the cartridge and a tester connected through the first slot assembly interface and the cartridge interface to provide at least power to each microelectronic device and to measure a performance of the microelectronic device, the vertical transportation apparatus being operable to move the cartridge and the slot assembly in a second vertical direction relative to one another, the second vertical direction being opposite to the first vertical direction to disengage the slot assembly interface from the cartridge interface, and the horizontal transportation apparatus being operable to move the cartridge horizontally from the second position to the first position out of the slot assembly.

The invention also provides a method of testing electronic devices including holding a cartridge holding a plurality of microelectronic devices in a first position at least partially outside a slot assembly on a frame, moving the cartridge horizontally from the first position to a second position into a slot assembly, moving the cartridge and the slot assembly in a first vertical direction relative to one another to engage a slot assembly interface on the slot assembly with a cartridge interface on the cartridge, testing the microelectronic devices through the first slot assembly interface and the cartridge interface by providing at least power to each microelectronic device and measuring a performance of the microelectronic device, moving the cartridge and the slot assembly in a second vertical direction relative to one another, the second vertical direction being opposite to the first vertical direction to disengage the slot assembly interface from the cartridge interface and moving the cartridge horizontally from the second position to the first position out of the slot assembly.

The invention further provides a cartridge including a socket made of insulative material and having upper and lower sides, the upper side having a first formation for releasably holding a first electronic device, the socket having a first socket thermal opening formed from the lower side to the upper side through the socket, an interface connected to the socket to connect the first device to an electric tester, a chuck of a thermally conductive material and a first thermal post attached to the chuck, the first thermal post being inserted into the first socket thermal opening, an end of the first thermal post being thermally connected to the first device, such that heat transfers primarily through the first thermal post as opposed to the insulative material of the socket between the chuck and the first electronic device.

The invention also provides a test piece including a socket made of insulative material and having upper and lower sides, the upper side having a first formation for releasably holding a first electronic device, the socket having a first socket thermal opening formed from the lower side to the upper side through the socket, a first thermally conductive post being insertable from the lower side into the first socket thermal opening, a first set of pins held in the socket and connecting the first device to the circuit board, the first set of pins being resiliently depressible and a lid that is movable relative to the socket to depress the first set of pins to bring the first electronic device into contact with the end of the first thermal post.

The invention further provides a test piece including a chuck of a thermally conductive material and a first thermal post attached to the chuck, the first thermal post being insertable into a first socket thermal opening with an end of the first thermal post being thermally connected to the first device, such that heat transfers primarily through the first thermal post as opposed to an insulative material of the socket between the chuck and the first electronic device.

The invention also provides a method of testing one or more electronic devices including releasably holding a first device a first formation of an upper side of a socket made of insulative material, connecting the first device to an electric tester through an interface connected to the socket, inserting a first thermal post attached to a chuck of thermally conductive material into a first socket thermal opening formed from a lower side to the upper side through the socket, an end of the first thermal post being thermally connected to the first device and transferring heat between the chuck and the first electronic device, the heat transferring primarily through the first thermal post as opposed to the insulative material of the socket.

The invention further provides a cartridge including a socket of insulative material and having upper and lower sides, a first formation on the upper side to hold a first electronic device, and a second formation on the upper side to hold a second electronic device, a lid, a first pusher plate rotatably mounted to the lid, a second pusher plate rotatably mounted to the lid, the lid being locatable over the socket and movable towards the socket, the rotatable mounting of the first pusher plate allowing for the first electronic device to rotate the first pusher plate relative to the lid and the rotatable mounting of the second pusher plate allowing the second electronic device to rotate the second pusher plate independently from the first pusher plate relative to the lid, a first set of contacts held in the socket to connect to the first electronic device, a first set of terminals connected to the first set of contacts, a second set of contacts held in the socket to connect to the second electronic device and a second set of terminals connected to the second set of contacts.

The invention also provides a method of testing one or more electronic devices including releasably holding a first electronic device in a first formation on an upper side of a socket of insulative material, releasably holding a second electronic device in a second formation on an upper side of a socket, locating a lid over the socket, the lid having a first pusher plate rotatably mounted to the lid and a second pusher plate rotatably mounted to the lid, moving the lid towards the socket, the rotatable mounting of the first pusher plate allowing for the first electronic device to rotate the first pusher plate relative to the lid and the rotatable mounting of the second pusher plate allowing the second electronic device to rotate the second pusher plate independently from the first pusher plate relative to the lid; and connecting the first and second electronic devices to an electric tester through an interface connected to the socket.

The invention further provides a cartridge including an electronic device holder having a formation for removably holding an electronic device having an input contact and a light emitter, an input contact on the electronic device holder to connect to the input contact on the electronic device to provide an input electric power through the input contact on the electronic device holder to the input contact on the electronic device, the input electric power causing the light emitter to transmit light, a light detector mounted to the electronic device holder and positioned to detect the light and generate an output electric power in response to a magnitude of the light and an output contact connected to the light detector to measure the output electric power.

The invention also provides a method of testing one or more electronic devices including inserting an electronic device having an input contact and a light emitter into a device holder, connecting an input contact on the electronic device holder to the input contact on the electronic device, providing an input electric power through the input contact on the electronic device holder to the input contact on the electronic device, the input electric power causing the light emitter to transmit light, detecting the light, transforming the light that is detected to an output electric power, measuring the output electric power through an output contact and removing the electronic device from the electronic device holder.

The invention further provides a testing apparatus including a socket having a formation for removably holding an electronic device having an input terminal and a light emitter, an input contact on the socket to connect to the input terminal on the electronic device to provide an input electric power through the input contact on the socket to the input terminal on the electronic device, the input electric power causing the light emitter to transmit light, a temperature modification device on a first side of the socket, which, when operated changes temperature to cause a temperature differential between the temperature modification device and the electronic device and a transfer of heat between the temperature modification device and the electronic device to modify a temperature of the electronic device, a heat sink on a side of the socket opposing the temperature modification device, the heat sink having a surface for absorbing the light, absorption of the light creating heat in the heat sink and a heat dissipation device thermally connected to the heat sink to remove the heat from the heat sink.

The invention also provides a method of testing one or more electronic devices including inserting an electronic device having an input contact and a light emitter into a socket, connecting an input contact on the socket to the input terminal on the electronic device, providing an input electric power through the input contact on the socket to the input terminal on the electronic device, the input electric power causing the light emitter to transmit light, changing a temperature of a temperature modification device on a first side of the socket to cause a temperature differential between the temperature modification device and the electronic device and a transfer of heat between the temperature modification device and the electronic device to modify a temperature of the electronic device, absorbing the light with a surface of a heat sink on a side of the socket opposing the temperature modification device, the absorption of the light creating heat in the heat sink, removing the heat from the heat sink with a heat dissipation device thermally connected to the heat sink; and removing the electronic device from the socket.

The invention further provides a cartridge including a socket of insulative material and having upper and lower sides and a formation on the upper side to hold an electronic device, a set of contacts held in the socket to connect to the electronic device, a set of terminals connected to the set of contacts held by the socket, a circuit board, the set of terminals connected to the set of contacts being connected to a set of contacts on the circuit board, a lid, a detector mounted to the lid, the lid being movable to be positioned over the socket with the detector located in a position to detect a feature of the electronic device when and due to power being supplied through at least one of the set of terminals held by the socket to the electronic device and a measurement channel connecting the detector to an interface on the circuit board.

The invention also provides a method of testing one or more electronic devices including releasably holding an electronic device in a socket of insulative material and having upper and lower sides and a formation on the upper side to hold an electronic device, connecting a set of contacts held in the socket to the electronic device, connecting a set of terminals connected to the set of contacts to a set of contacts on a circuit board, moving a lid having a detector mounted thereto over the socket, connecting the detector through a measurement channel to an interface on the circuit board, supplying power through at least one of the contacts held by the socket to the electronic device, detecting a feature of the electronic device when and due to power being supplied through at least one of the contacts held by the socket to the electronic device and measuring the feature through the interface.

The invention further provides a cartridge including a supporting board having a post opening therethrough, a backing structure, on a first side of the supporting board, and including at least a circuit board having a contact, a conductor having a contact to make contact with a terminal on an electronic device positioned on a second side of the supporting board opposing the first side of the supporting board, a portion held by the supporting board and a terminal connected to the contact on the circuit board, a spring, a force generation device on a side of the electronic device opposing the supporting board, the force generation device and the supporting board being movable relative to one another to move the electronic device closer to the supporting board and deform the spring and a post having a stand-off with a surface in a plane spaced from a plane of a surface of the supporting board to prevent movement of the electronic device closer to the supporting board, a force transfer portion extending from the stand-off at least partially through the post opening, and a force delivery portion extending from the force transfer portion, the force delivery portion being held by the backing structure.

The invention also provides a cartridge including positioning a backing structure, including at least a circuit board having a contact, on a first side of a supporting board, connecting a contact of a conductor to a terminal on and electronic device positioned on a second side of the supporting board opposing the first side of the supporting board, the conductor having a portion held by the supporting board and a terminal connected to the contact on the circuit board, positioning a force generation device on a side of the electronic device opposing the supporting board, moving the force generation device and the supporting board being relative to one another to move the electronic device closer to the supporting board and deform a spring against a spring force thereof, preventing movement of the electronic device closer to the supporting board with a post having a stand-off with a surface in a plane spaced from a plane of a surface of the supporting board, receiving with the stand-off of a post a force from the electronic device, transferring the force from the stand-off at least partially through the opening with a force transfer portion of the post extending from the stand-off at least partially through a post opening formed through the supporting board, receiving the force with a force delivery portion of the post extending from the force transfer portion, the force delivery portion being held by the backing structure and delivering the force to the backing structure.

A tester apparatus including a voltage targeting system, a holder for holding a plurality of electronic devices in at least first and second clusters, at least one voltage source connectable to the electronic devices of the first cluster to provide a first test voltage to the electronic devices of the first cluster in parallel and connectable to the electronic devices of the second cluster to provide a first test voltage to the electronic devices of the second cluster in parallel, at least one current detector connectable to the devices of the first cluster to measure a first test current from the devices of the first cluster, the first test current from the devices of the first cluster that is measured by the current detector being a total current of the devices of the first cluster in parallel, and connectable to the devices of the second cluster to measure a first test current from the devices of the second cluster, the first test current that is measured by the current detector from the devices of the second cluster being a total current of the devices of the second cluster in parallel, wherein the voltage targeting system carries out a first comparison by comparing the first test current from the devices of the first cluster that is measured with a target current, a first voltage adjuster that adjusts the first test voltage to a second test voltage for the first cluster in response to the first comparison so that the first test current from the devices of the first cluster is adjusted to a second test current that is closer to the target current, wherein the voltage targeting system carries out a second comparison by comparing the first test current from the devices of the second cluster that is measured with a target current; and a second voltage adjuster that adjusts the first test voltage to a second test voltage for the second cluster in response to the second comparison so that the first test current from the devices of the second cluster is adjusted closer to a second test current that is closer to the target current.

The invention also provides a method of testing a plurality of electronic devices including holding the plurality of electronic devices in at least first and second clusters, connecting at least one voltage source to the electronic devices of the first cluster to provide a first test voltage to the electronic devices of the first cluster in parallel and connectable to the electronic devices of the second cluster to provide a first test voltage to the electronic devices of the second cluster in parallel, connecting the at least one voltage source to the electronic devices of the second cluster to provide a first test voltage to the electronic devices of the second cluster in parallel, measuring, with at least one current detector, a first test current from the devices of the second cluster, the first test current that is measured by the current detector from the devices of the second cluster being a total current of the devices of the second cluster in parallel, measuring, with the at least one current detector, a first test current from the devices of the second cluster, the first test current that is measured by the current detector from the devices of the second cluster being a total current of the devices of the second cluster in parallel, carrying a first comparison out with a voltage targeting system by comparing the first test current from the devices of the first cluster that is measured with a target current, adjusting, with a first voltage adjuster, the first test voltage to a second test voltage for the first cluster in response to the first comparison so that the first test current from the devices of the second cluster is adjusted to a second test current that is closer to the target current, carrying a second comparison out with the voltage targeting system by comparing the first test current from the devices of the second cluster that is measured with a target current and adjusting, with a second voltage adjuster, the first test voltage to a second test voltage for the second cluster in response to the second comparison so that the first test current from the devices of the second cluster is adjusted closer to a second test current that is closer to the target current.

BRIEF DESCRIPTION OF THE DRAWINGS

The invention is further described by way of examples with reference to the accompanying drawings, wherein:

FIGS. 9A, 9B and 10 are side views illustrating an apparatus that is used for insertion and removal of portable cartridges into and out of the oven;

DETAILED DESCRIPTION OF THE INVENTION

Figure 1:
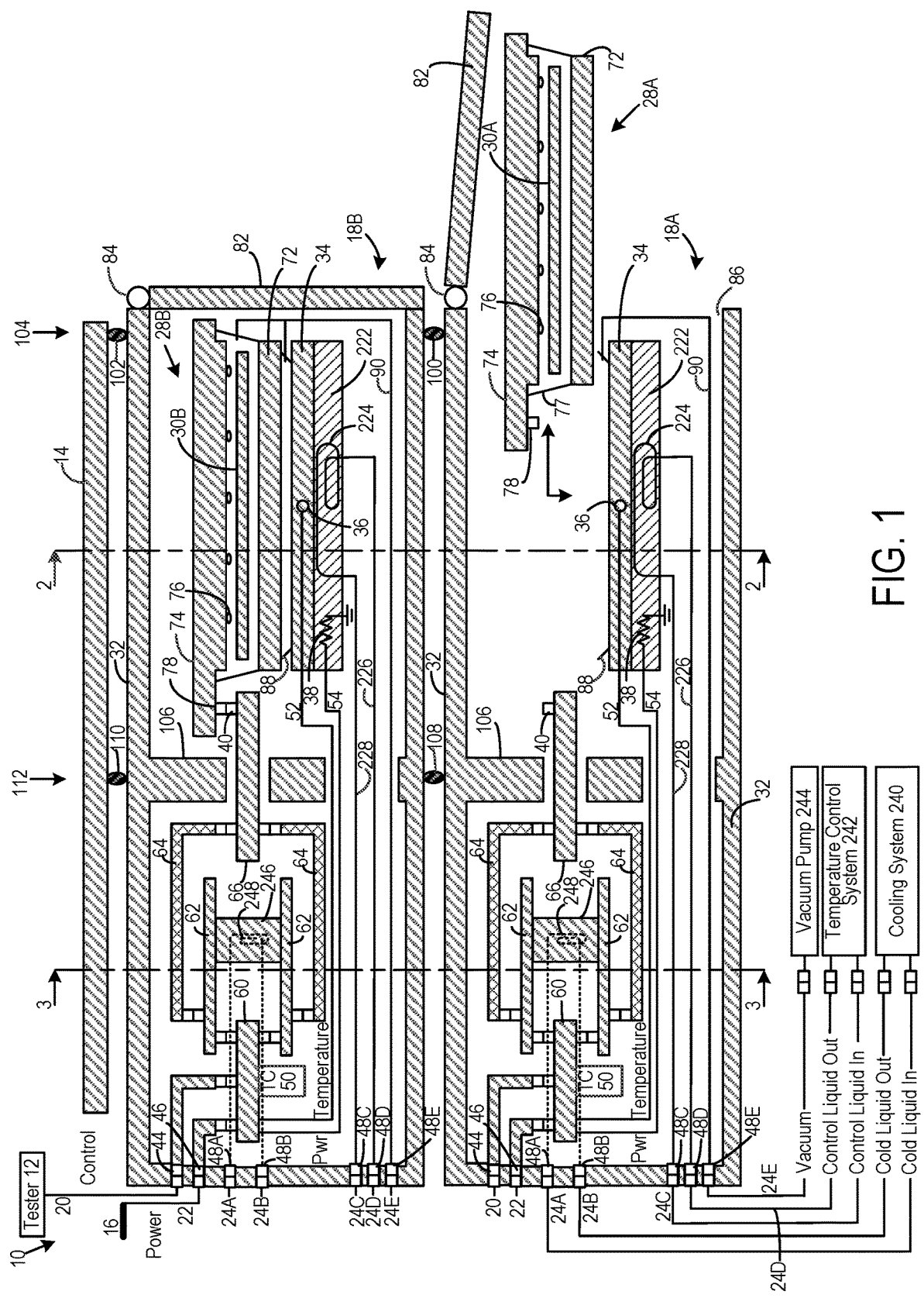
FIG. 1 is a cross-sectional side view of a tester apparatus having slot assemblies according to one embodiment of the invention.

FIG. 1 of the accompanying drawings illustrates a tester apparatus 10, according to an embodiment of the invention, that includes a tester 12, a frame 14, a power bus 16, first and second slot assemblies 18A and 18B, a tester cable 20, a power cable 22, a cold liquid supply line 24A, a cold liquid return line 24B, a control liquid supply line 24C, a control liquid return line 24D, a vacuum line 24E, first and second cartridges 28A and 28B, and first and second wafers 30A and 30B.

The slot assembly 18A includes a slot assembly body 32, a thermal chuck 34, a temperature detector 36, a temperature modification device in the form of a heating resistor 38, a first slot assembly interface 40, and a plurality of second slot assembly interfaces, including a control interface 44, a power interface 46 and a cold liquid supply interface 48A, a cold liquid return interface 48B, a control liquid supply interface 48C, a control liquid return interface 48D and a vacuum interface 48E.

The first slot assembly interface 40 is located within the slot assembly body 32 and is mounted to the slot assembly body 32. The second interfaces in the form of the control interface 44, the power interface 46 and the interfaces 48A to 48E are mounted in a left wall of the slot assembly body 32.

The slot assembly 18A is insertable from left to right into and is removable from right to left from the frame 14. The tester cable 20, the power cable 22 and the lines 24A to 24E are manually connected to the control interface 44, the power interface 46 and the interfaces 48A to 48E respectively. Before removing the slot assembly 18A from the frame 14, the tester cable 20, power cable 22 and the lines 24A to 24E are first manually disconnected from the control interface 44, power interface 46 and the interfaces 48A to 48E respectively.

The slot assembly 18A includes a motherboard 60 having test electronics, a plurality of channel module boards 62 having test electronics, flexible connecters 64, and a connection board 66. The control interface 44 and the power interface 46 are connected to the motherboard 60 and a thermal controller 50 is mounted to the motherboard 60. The channel module boards 62 are electrically connected to the motherboard 60. The flexible connectors 64 connect the channel module boards 62 to the connection board 66. Control functionality is provided through electrical conductors connecting the control interface 44 to the motherboard 60. Power is provided through the power interface 46 to the motherboard 60. Both power and control are provided from the motherboard 60 through conductors to the channel module boards 62. The flexible connectors 64 provide conductors that connect the channel module boards 62 to the connection board 66. The connection board 66 includes a conductor that connects the flexible connectors 64 to the first slot assembly interface 40. This first slot assembly interface 40 is thus connected through various conductors to the control interface 44 and power interface 46 so that power and control can be provided via the control interface 44 and power interface 46 to the first slot assembly interface 40.

The second slot assembly 18B includes similar components to the first slot assembly 18A and like reference numerals indicate like components. The second slot assembly 18B is inserted into the frame 14 and the control interface 44, power interface 46 and interfaces 48A to 48E of the second slot assembly 18B are manually connected to a separate set of connecting components including a separate tester cable 20, a separate power cable 22 and separate lines 24A to 24E, respectively.

The cartridge 28A includes a cartridge body formed by a thin chuck 72 and a backing board 74. The wafer 30A has a plurality of microelectronic devices formed therein. The wafer 30A is inserted into the cartridge body between the thin chuck 72 and backing board 74. Cartridge contacts 76 make contact with respective contacts (not shown) on the wafer 30A. The cartridge 28A further includes a cartridge interface 78 on the backing board 74. Conductors in the backing board 74 connect the cartridge interface 78 to the cartridge contacts 76.

The cartridge 28A has a seal 77 connected between the backing board 74 and the thin chuck 72. A vacuum is applied to an area defined by the seal 77, backing board 74 and the thin chuck 72. The vacuum keeps the cartridge 28A together and ensures proper contact between the cartridge contacts 76 and the contacts on the wafer 30A.

The temperature detector 36 is in located in the thermal chuck 34 and therefore close enough to the wafer 30A to detect a temperature of the wafer 30A or to within five degrees Celsius, preferably to within one or two degrees Celsius of the wafer 30A.

The slot assembly 18A further has a door 82 connected to the slot assembly body 32 by a hinge 84. When the door 82 is rotated into an open position, the cartridge 28A can be inserted through a door opening 86 into the slot assembly body 32. The cartridge 28A is then lowered onto the thermal chuck 34 and the door 82 is closed. The thermal chuck 34 is mounted to the slot assembly body 32. The thermal chuck 34 then essentially forms a holder having a testing station for a wafer.

The slot assembly 18A further has a seal 88 that is located between the thermal chuck 34 and the thin chuck 72. A vacuum is applied through the vacuum interface 48E and a vacuum line 90 to an area defined by the seal 88, thermal chuck 34 and thin chuck 72. A good thermal connection is thereby provided between the thermal chuck 34 and the thin chuck 72. When heat is created by the heating resistor 38, the heat conducts through the thermal chuck 34 and the thin chuck 72 to reach the wafer 30A. Heat conducts in an opposite direction when the thermal chuck 34 is at a lower temperature than the wafer 30A.

The cartridge interface 78 engages with the first slot assembly interface 40. Power and signals are provided via the first slot assembly interface 40, cartridge interface 78 and cartridge contacts 76 to the wafer 30A. A performance of devices within the wafer 30A is measured through the cartridge contacts 76, cartridge interface 78 and first slot assembly interface 40.

The door 82 of the slot assembly 18B is shown in a closed position. A front seal 100 is mounted on an upper surface of the slot assembly 18A and seals with a lower surface of the slot assembly 18B. A front seal 102 is mounted to an upper surface of the slot assembly 18B and seals with a lower surface of the frame 14. A continuous sealed front wall 104 is provided by the doors 82 of the slot assemblies 18A and 18B and the front seals 100 and 102.

The slot assembly 18A further includes a thermal controller 50. The temperature detector 36 is connected through a temperature feedback line 52 to the thermal controller 50. Power is provided through the power interface 46 and a power line 54 to the heating resistor 38 so that the heating resistor 38 heats up. The heating resistor 38 then heats the thermal chuck 34 and the wafer 30A on the thermal chuck 34. The heating resistor 38 is controlled by the thermal controller 50 based on the temperature detected by the temperature detector 36.

The thermal chuck 34 has a thermal fluid passage 224 formed therein. The thermal fluid passage 224 holds a thermal fluid. The thermal fluid is preferably a liquid as opposed to a gas because liquid is not compressible and heat convects faster to or from a liquid. Different thermal fluids are used for different applications with oil being used for applications where temperatures are the highest.

Control liquid supply and return lines 226 and 228 connect opposing ends of the thermal fluid passage 224 to the cold liquid supply and return interfaces 48C and 48D, respectively. The heating resistor 38 serves as a heater that is mounted in a position to heat the thermal chuck 34, which heats the thermal fluid. By recirculating the thermal fluid through the thermal fluid passage 224, a more uniform distribution of heat is provided by the thermal chuck 222 to the thermal chuck 34 and ultimately to the wafer 30A. The temperature of the fluid can also be controlled to add heat to the thermal chuck 34 or to cool the thermal chuck 34 down.

The tester apparatus 10 further includes a cooling system 240, a temperature control system 242 and a vacuum pump 244. The two cold liquid supply lines 24A that are connected to the first and second slot assemblies 18A and 18B are also connected through a manifold (not shown) to the cooling system 240. Additional manifolds connect the cold liquid return lines 24B to the cooling system 240, the control liquid supply lines 24C to the temperature control system 242, the control liquid return lines 24D to the temperature control system 242 and the vacuum lines 24E to the vacuum pump 244. Each slot assembly 18A or 18B has a respective cold plate 246 with a respective fluid passage 248. The cooling system 240 circulates a fluid through the fluid passage 248 to cool the cold plate 246. The cold plate 246 then keeps the channel module boards 62 cool. The temperature control system 242 circulates a fluid through the thermal fluid passage 224 to control a temperature of the thermal chuck 34 and transfer heat from or to the wafers 30A and 30B. The vacuum pump 244 provides air at vacuum pressure to the vacuum line 90.

The slot assembly 18A includes a separator seal 108 mounted to an upper surface the slot assembly body 32 above the internal wall 106 thereof. The separator seal 108 seals with a lower surface of the slot assembly 18B. The slot assembly 18B has a separator seal 110 mounted to an upper surface of the slot assembly body 32 thereof. The separator seal 108 seals with a lower surface of the frame 14. A continuous sealed separator wall 112 is provided by the internal walls 106 of the slot assemblies 18A and 18B and the separator seals 108 and 110.

Figure 2:
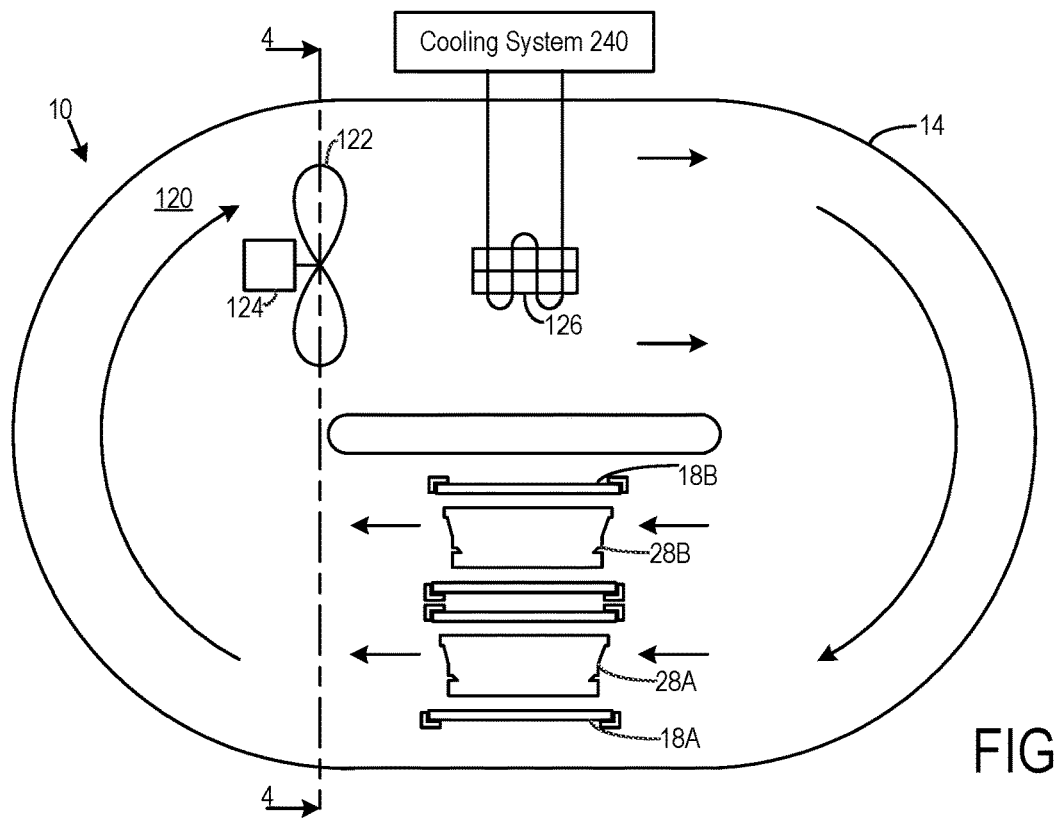
FIG. 2 is a cross-sectional side view of the tester apparatus on line 2-2 in FIG. 1.

FIG. 2 illustrates the tester apparatus 10 on 2-2 in FIG. 1. The frame 14 defines a first closed loop air path 120. Air inlet and outlet openings (not shown) can be opened to change the first closed loop air path 120 into an open air path wherein air at room temperature passes through the frame 14 without being recirculated. A closed loop path is particularly useful in a clean room environment because it results in less particulate material being released into the air.

The tester apparatus 10 further includes a first fan 122, a first fan motor 124 and a temperature modification device in the form of a water cooler 126.

The first fan 122 and first fan motor 124 are mounted in an upper portion of the first closed loop air path 120. The water cooler 126 is mounted to the frame 14 within an upper portion of the first closed loop air path 120.

The cartridges 28A and 28B are positioned with the slot assemblies 18A and 18B and are within a lower half of the first closed loop air path 120.

In use, current is provided to the first fan motor 124. The first fan motor 124 rotates the first fan 122. The first fan 122 recirculates air in a clockwise direction through the first closed loop air path 120.

The water cooler 126 then cools the air in the first closed loop air path 120. The air then flows through the slot assemblies 18A and 18B over the cartridges 28A or 28B. The cartridges 28A or 28B are then cooled by the air through convection.

Figure 3:
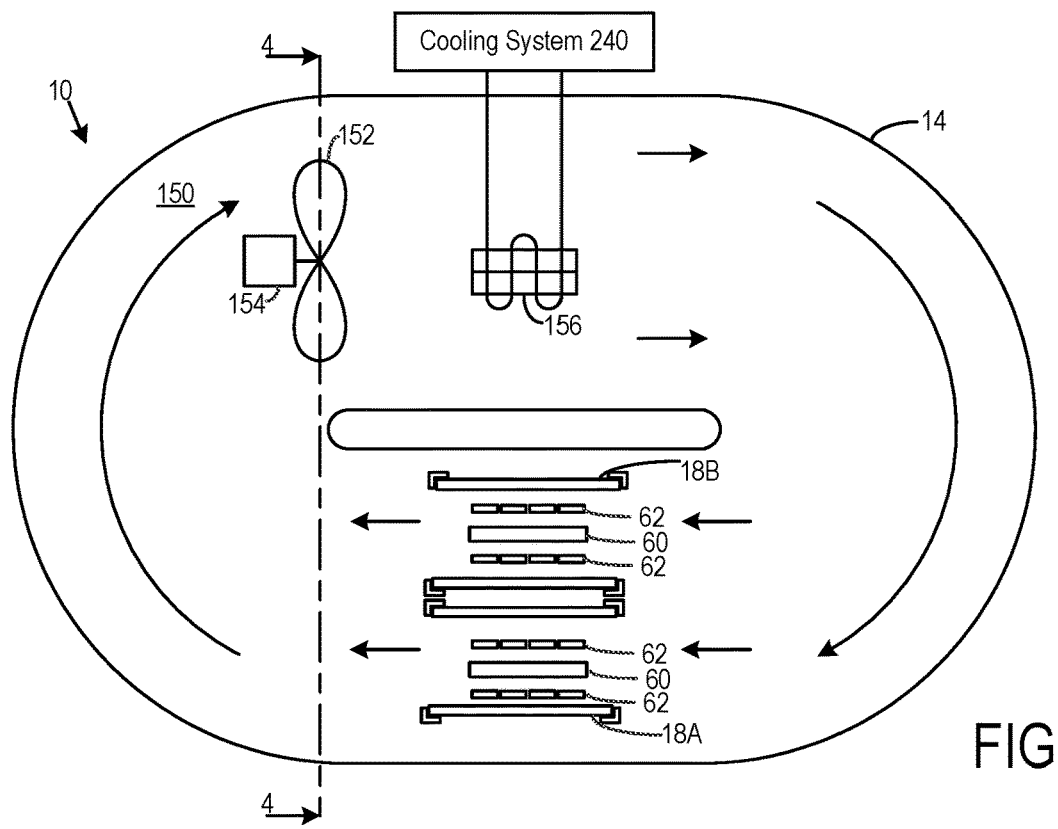
FIG. 3 is a cross-sectional side view of the tester apparatus on line 3-3 in FIG. 1.

FIG. 3 shows the tester apparatus 10 on 3-3 in FIG. 1. The frame 14 defines a second closed loop air path 150. The tester apparatus 10 further includes a second fan 152, a second fan motor 154 and a temperature modification device in the form of a water cooler 156. No electric heater or damper is provided as in FIG. 2. Air inlet and outlet openings (not shown) can be opened to change the second closed loop air path 150 into an open air path wherein air at room temperature passes through the frame 14 without being recirculated.

A closed loop path is particularly useful in a clean room environment because it results in less particulate material being released into the air. The second fan 152 and second fan motor 154 are located in an upper portion of the second closed loop air path 150. The water cooler 156 is located slightly downstream from the second fan 152 within the second closed loop air path 150. The motherboard 60 and channel module boards 62 that form a part of the slot assemblies 18A and 18B are located within a lower half of the second closed loop air path 150.

In use, electric current is provided to the second fan motor 154, which rotates the second fan 152. The second fan 152 then recirculates air in a clockwise direction through the second closed loop air path 150. The air is cooled by the water cooler 156. The cooled air then passes over the motherboard 60 and channel module boards 62 so that heat transfers from the motherboard 60 and channel module boards 62 to the air through convection.

Air recirculating through the first closed loop air path 120 in FIG. 2 is kept separate from air in the second closed loop air path 150 in FIG. 3 by the continuous sealed separator wall 112 shown in FIG. 1. The continuous sealed front wall 104 shown in FIG. 1 prevents air from escaping out of the first closed loop air path 120.

Figure 4:
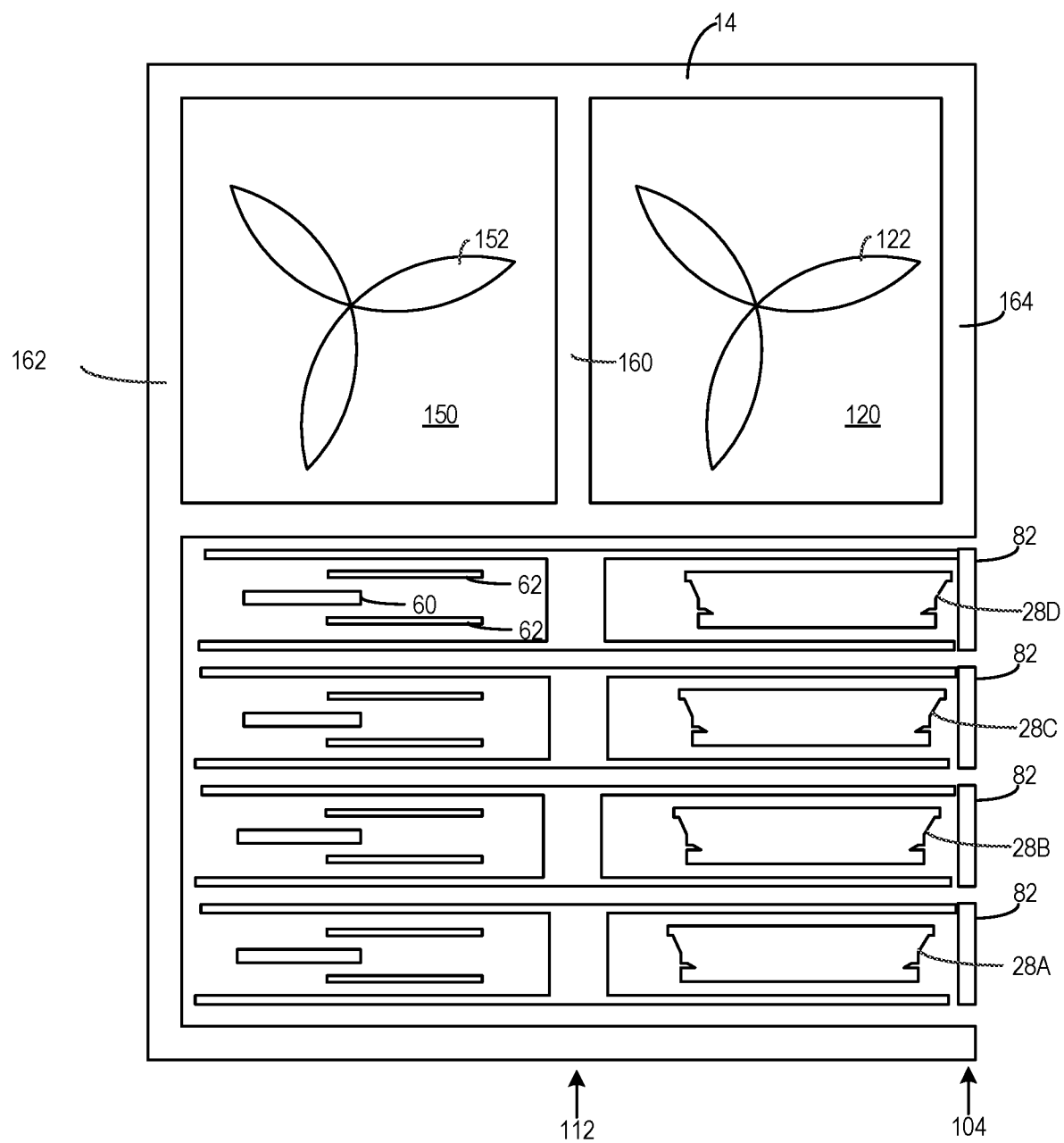
FIG. 4 is a cross-sectional side view of the tester apparatus on line 4-4 in FIGS. 2 and 3.

As shown in FIGS. 2 and 3, the same cooling system 240 that is used in FIG. 1 is also used to cool the water coolers 126. As shown in FIG. 4, a plenum 160 separates the first closed loop air path 120 from the second closed loop air path 150 in all areas except those provided by the continuous sealed separator wall 112. The frame 14 has left and right walls 162 and 164 that further define the closed loop air paths 120 and 150.

Figure 5A:
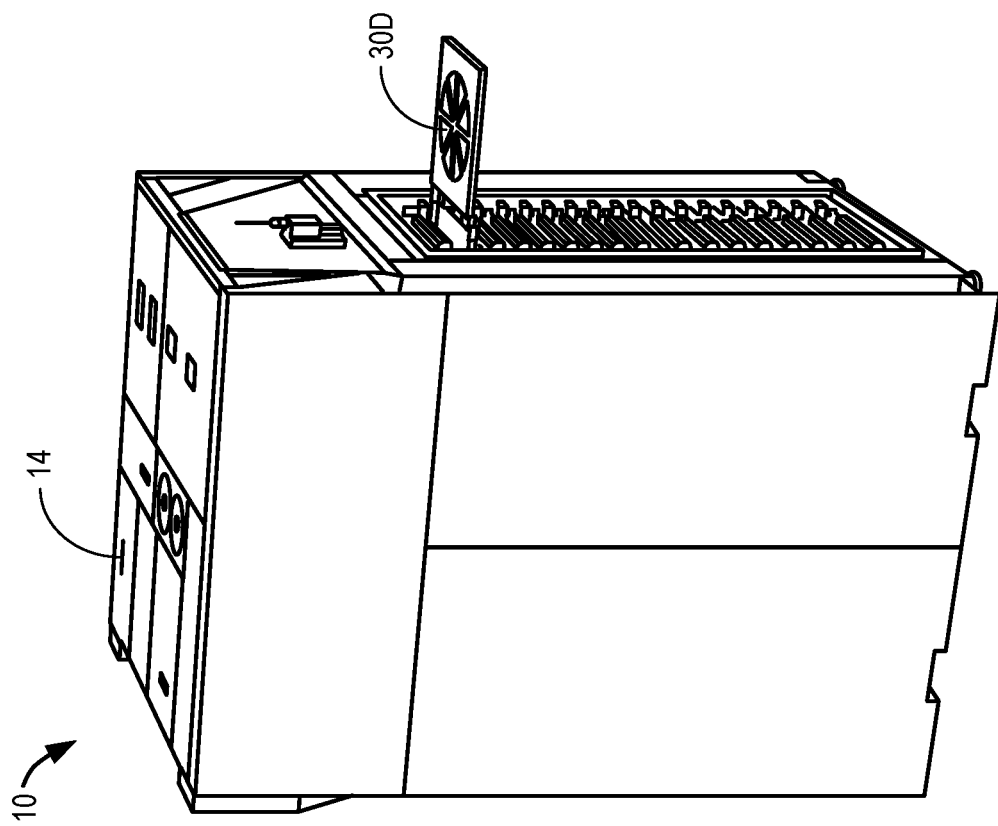
FIGS. 5A, 5B and 5C are perspective views of the tester apparatus illustrating insertion or removal of portable cartridges into or out of an oven defined by a frame.
Figure 5B:
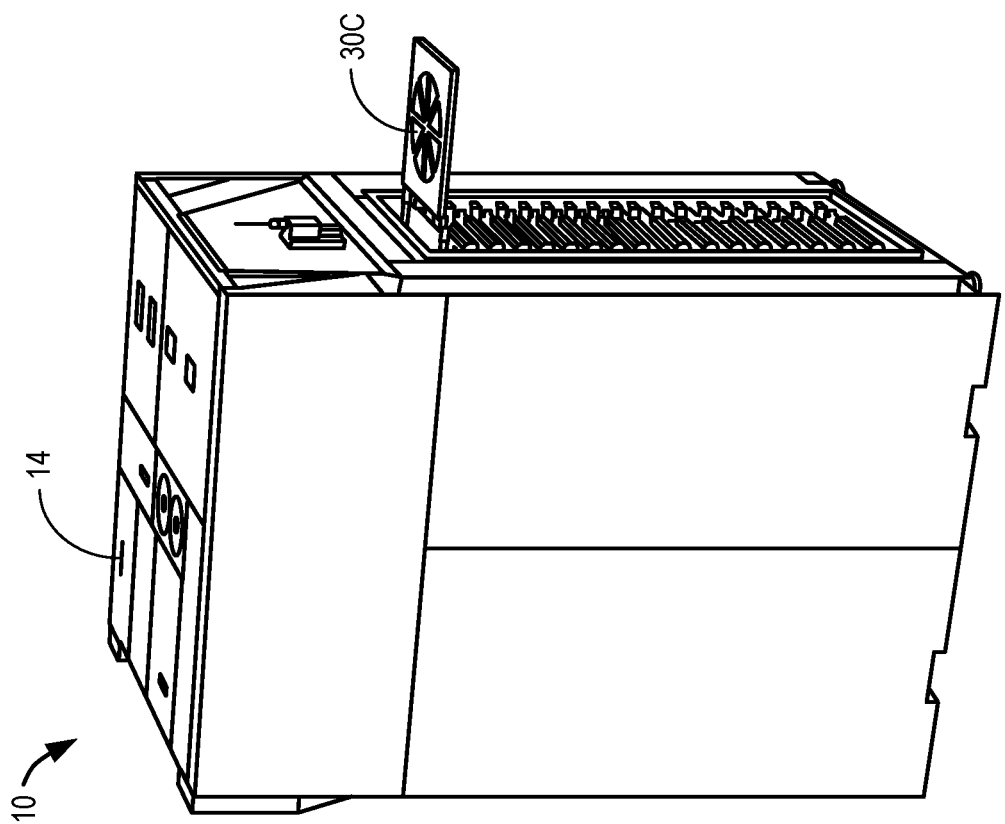
Figure 5C:
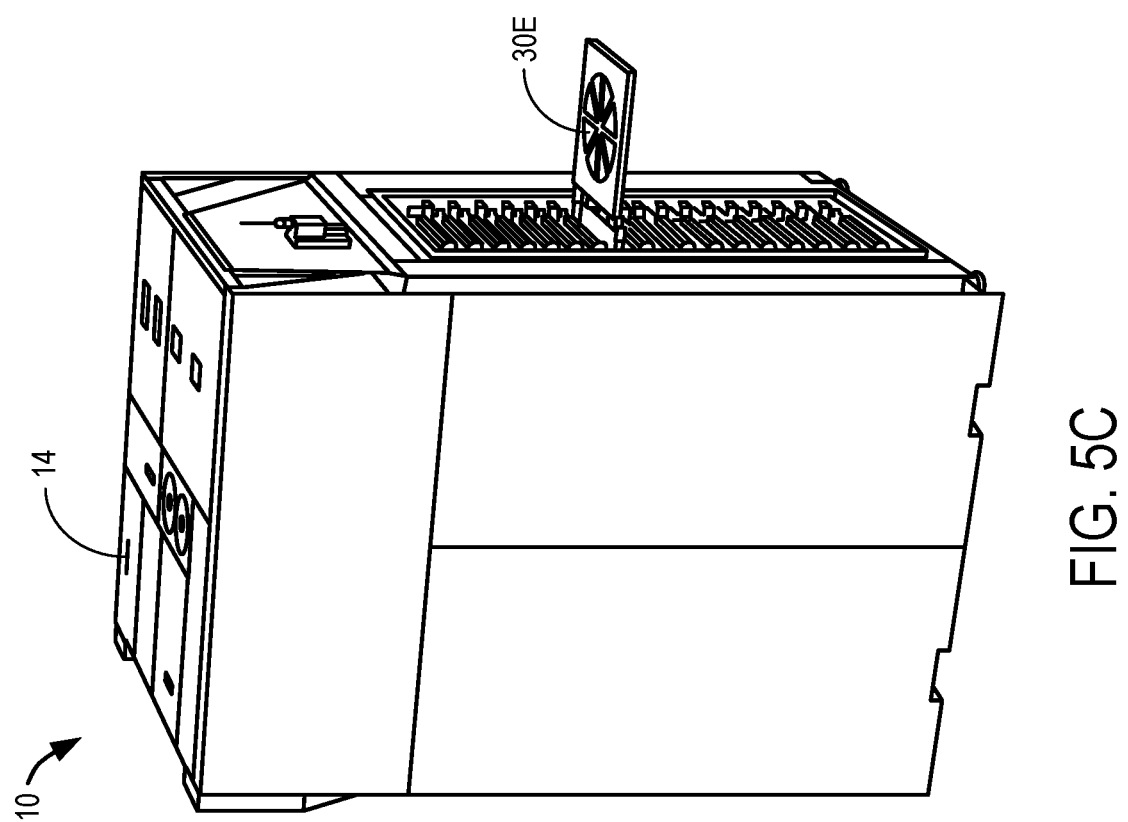
Figure 6:
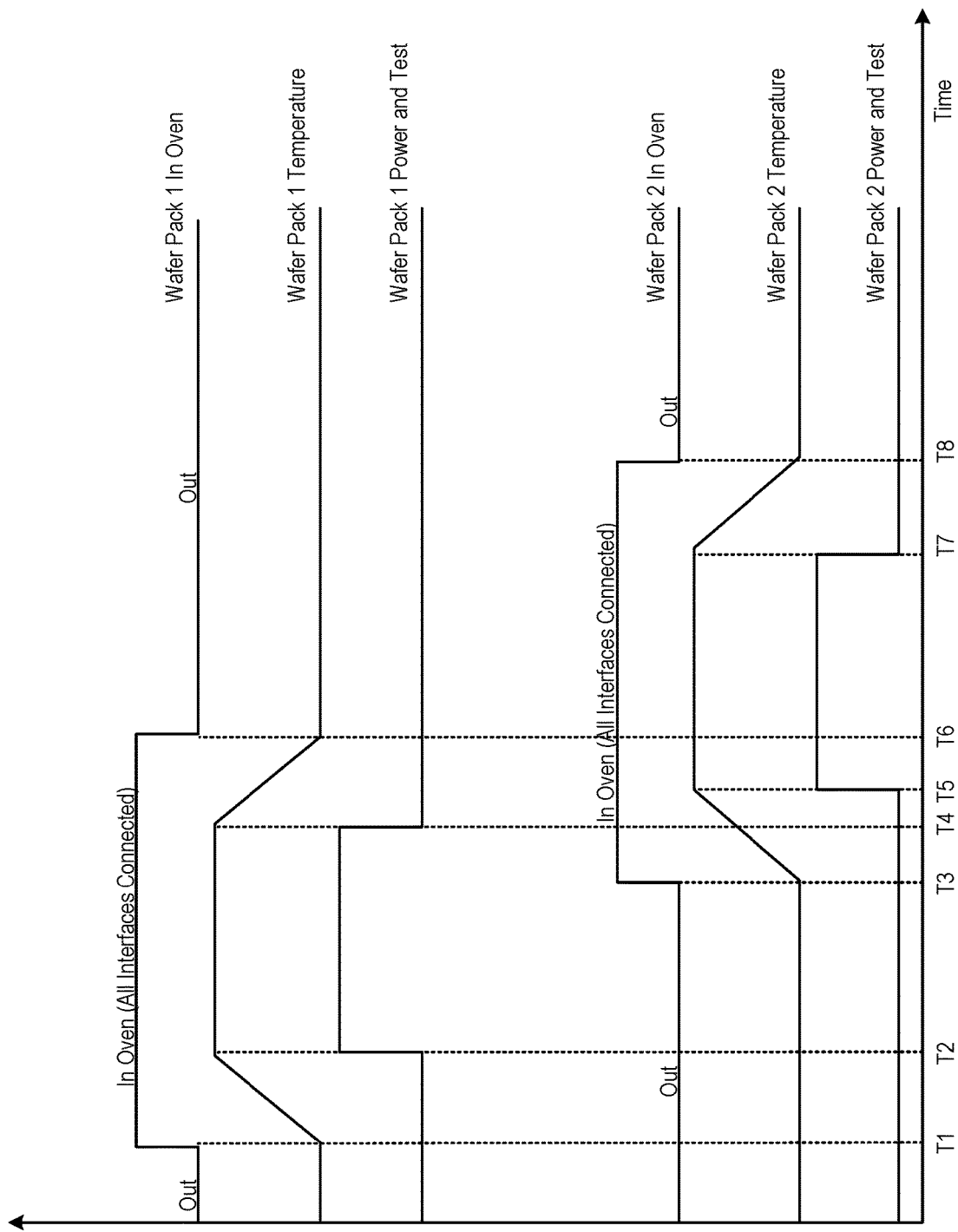
FIG. 6 is a time chart showing how one cartridge can be inserted and used for testing electronic devices of wafers and subsequent insertion of another cartridge.

FIGS. 5A, 5B and 5C illustrate how cartridges 30C, 30D and 30E can be inserted or be removed at any time while all other cartridges are being used to test devices of wafers and may be in various states of temperature ramps. FIG. 6 illustrates the concept in more detail. At time T1 a first cartridge is inserted into the frame 14 while a second cartridge is outside the frame 14. At T1 heating of the first cartridge is initiated. Between T1 and T2 the temperature of the first cartridge increases from room temperature, i.e. about 22° C., to a testing temperature that is 50° C. to 150° C. higher than room temperature at T2. At T2 power is applied to the first cartridge and the devices in the first cartridge are tested. At T3, a second cartridge is inserted into the frame 14 and heating of the second cartridge is initiated. At T4, testing of the first cartridge is terminated. At T4, cooling of the first cartridge is also initiated. At T5, the second cartridge reaches testing temperature and power is provided to the second cartridge and the wafer in the second cartridge is tested. At T6, the second cartridge reaches a temperature close to room temperature and is removed from the frame 14. A third cartridge can then be inserted in place of the first cartridge. At T7, testing of the second cartridge is terminated and cooling thereof is initiated. At T8, the second cartridge has cooled down to room temperature or close to room temperature and is removed from the frame 14.

Different tests can be conducted at different temperatures. By way of example, a cartridge may be inserted and a test be run at room temperature. Another test can be conducted during an upward ramp in temperature. A further test can be conducted at an elevated temperature. A further test can be conducted during a downward ramp in temperature. Two of these tests can be a single test that runs form one temperature stage to the next.

Figure 7:
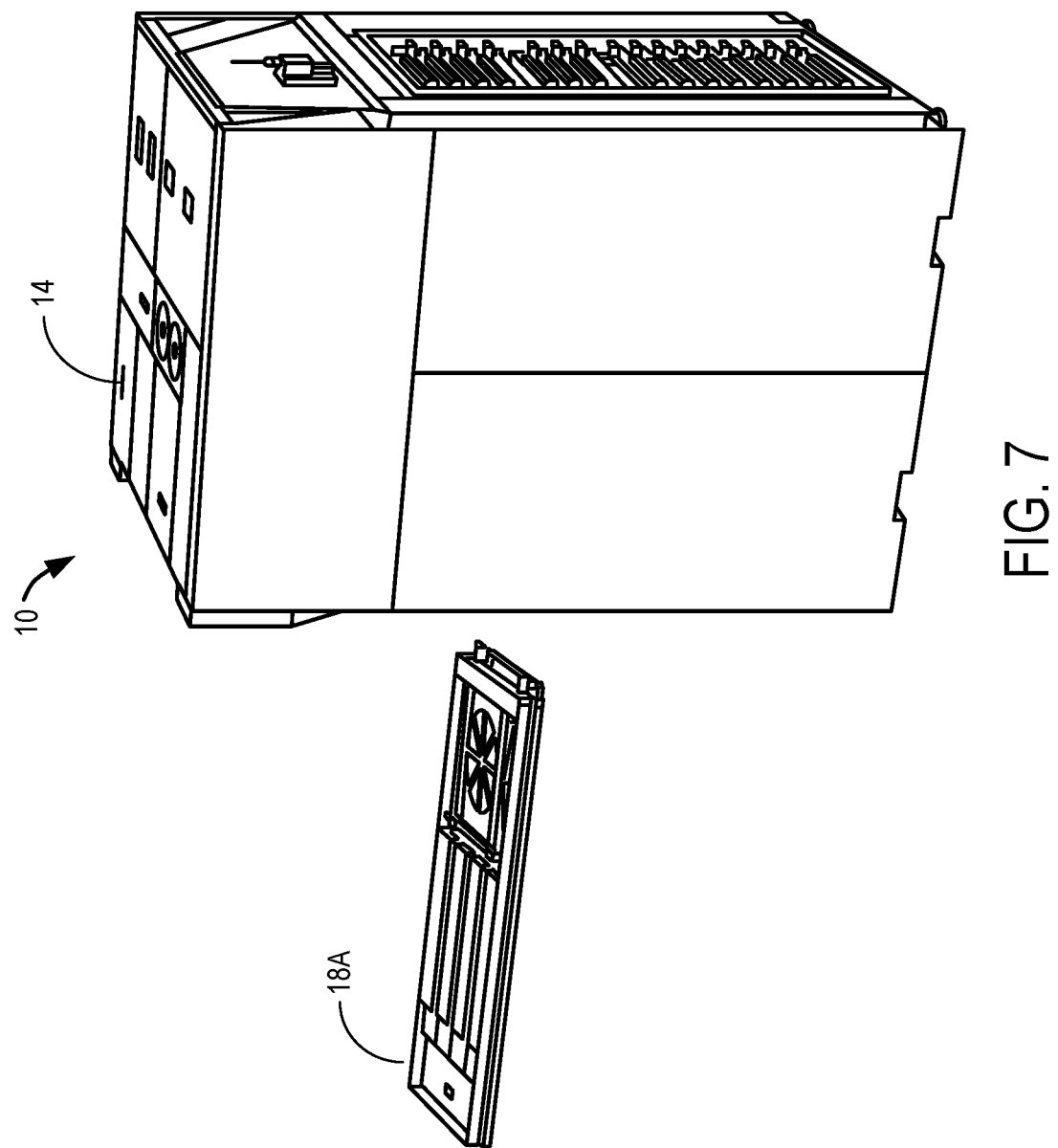
FIG. 7 is a perspective view of the tester apparatus illustrating insertion or removal of one slot assembly.

As shown in FIG. 7, one slot assembly 18A can be removed or be inserted into the frame 14. The slot assembly 18A can be inserted or be removed while the other slot assemblies within the frame 14 are used for testing devices of wafers as described with reference to FIG. 6.

Figure 8A:
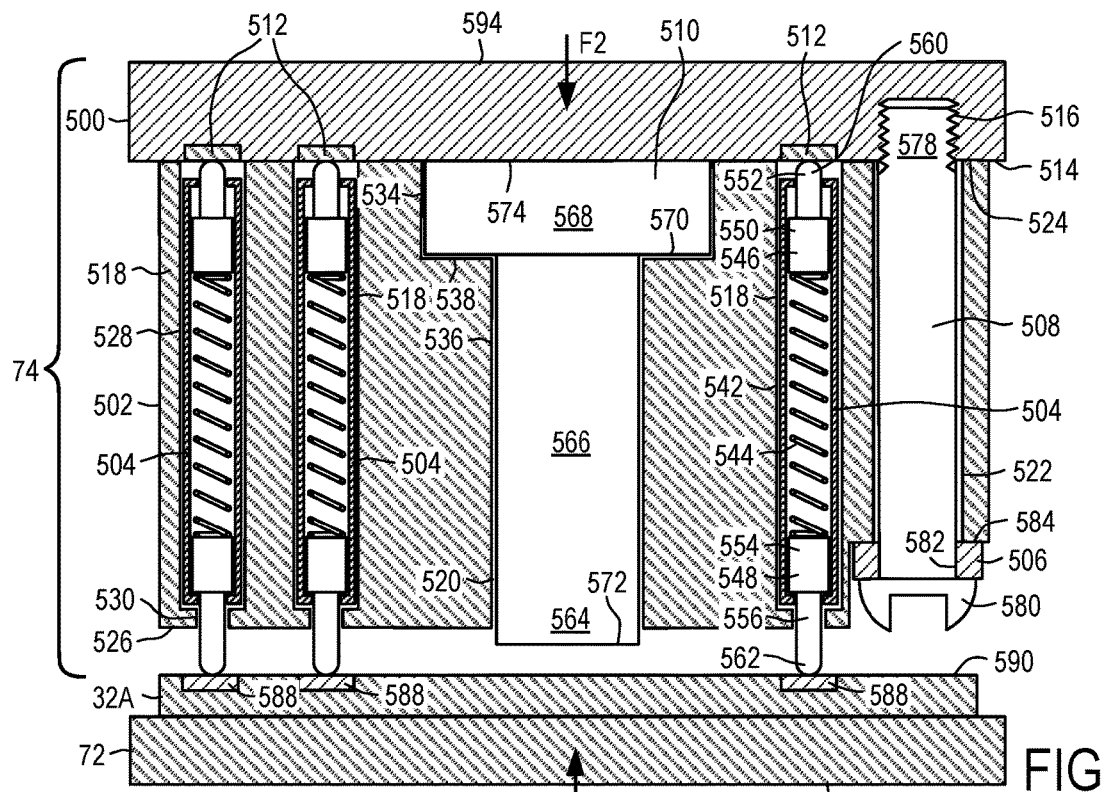
FIGS. 8A and 8B are cross-sectional side views illustrating the use of a stand-off in the configuration of the cartridge described with respect to FIGS. 1-7.

As shown in FIG. 8A, the backing board 74 includes a circuit board 500, a contactor 502, a plurality of pins 504, a securing ring 506, a fastener 508, and a post 510.

The circuit board 500 is primarily made of an insulative material and has a circuit (not shown) formed therein. Contacts 512 are formed on a lower side 514 of the circuit board 500. A threaded opening 516 is formed into the lower side 514.

The contactor 502 has a plurality of pin openings 518, a post opening 520 and a fastener opening 522 formed from an upper side 524 to a lower side 526 therethrough. Each one of the pin openings 518 has a first section 528 and a second section 530. The first and second sections 528 and 530 are both circular when viewed in plan view. The first section 528 has a larger diameter than the second section 530. The larger diameter of the first section 528 when compared to the diameter of the second section 530 results in the first section 528 being wider than the second section 530 when view in the cross-sectional side view of FIG. 8A.

The post opening 520 has a first section 534 and a second section 536. The first section 534 and the second section 536 are both circular when viewed in plan view. A diameter of the first section 534 is larger than a diameter of the second section 536. Because the diameter of the first section 534 is more than the diameter of the second section 536, the first section 534 is wider than the second section 536 when view in the cross-sectional side view of FIG. 8A. The first and second sections 534 and 536 have vertical side walls. A horizontal landing 538 connects the vertical side walls of the first and second sections 534 and 536.

Each pin 504 includes an electrically conductive retainer portion 542, a coil spring 544 and first and second end pieces 546 and 548. The first end piece 546 has a first inner portion 550 and a first tip 552. The second end piece 548 has a second inner portion 554 and a second tip 556. The coil spring 544 and the first and second inner portions 550 and 554 are retained with the retainer portion 542 with the coil spring 544 located between the first and second inner portions 550 and 554. The first and second tips 552 and 556 protrude out of upper and lower ends, respectively, of the retainer portion 542.

An upper surface of the first tip 552 forms a terminal 560. A lower end of the second tip 556 forms a contact 562. The coil spring 544 and the first and second end pieces 546 and 548 are made of metal and, therefore, electrically conductive material. The coil spring 544 and the first and second end pieces 546 and 548 form a conductor that is capable of conducting current between the terminal 560 and the contact 562.

A respective pin is inserted through the upper side 524 into a respective pin opening 518. The second tip 556 is slightly smaller than the second section 530 so that it passes through the second section 530 and protrudes from the lower side 526. The retainer portion 542 is slightly narrower than the first section 528, but is wider than the second section 530 to prevent the pin 504 from falling out of the lower side 526. When the pin 504 is fully inserted into the pin opening 518, and before the contactor 502 is mounted to the circuit board 500, the first tip 552 still protrudes above the upper side 524 of the contactor 502.

The post 510 has a stand-off 564, a force transfer potion 566 and a force delivery portion 568. The post 510 is made out of a single piece of metal or other material that is chosen because of its strength when compared to the strength and brittleness of the ceramic material of the contactor 502.

The post 510 is inserted through the upper side 524 into the post opening 520. The stand-off 564 and the force transfer portion 566 are slightly narrower than the second section 536. The force delivery portion 568 is slightly narrower than the first section 534, but wider than the second section 536. A lower surface 570 of the force delivery portion 568 abuts against the landing 538. The post 510 is thereby prevented from falling out of the lower side 526.

The post 510 has a surface 572 that, when the post 510 is fully inserted as shown in FIG. 8A, is in a plane that is parallel and below a surface of the lower side 526. When the post 510 is fully inserted, the force delivery portion 568 has a surface 574 that is in the same plane as the upper side 524.

The circuit board 500 is positioned on top of the contactor 502. Each one of the contacts 512 makes contact with a respective one of the terminals 560. Because the terminals 560 are in a plane above a plane of the upper side 524, the lower side 514 is initially spaced from the upper side 524.

The fastener 508 has a threaded shaft 578 and a head 580. The ring 506 has a ring opening 582. The ring 506 is located on a lower surface 584 of the contactor 502. The threaded shaft 578 is inserted from the bottom through the ring opening 582 and then through the fastener opening 522. The head 580 comes into contact with a lower surface of the ring 506. The head 580 is then turned so that thread on the threaded shaft 578 screws into thread on the threaded opening 516. The threading action moves the circuit board 500 closer to the contactor 502 and the ring 506. The lower side 514 eventually comes into contact with the upper side 524. The contacts 512 move the first end piece 546 downward into the pin opening 518 until the terminals 560 are in the same plane as the upper side 524. The coil spring 544 compress, and therefore deform slightly to allow for relative movement of the first end piece 546 relatively towards the second end piece 548.

The lower side 514 has a section that comes to a standstill against the surface 574 forming part of the post 510. Because the post 510 abuts against the circuit board 500, the post 510 is in a position to transfer a force through the surface 572 to the circuit board 500.

The first wafer 32A has a plurality of electronic devices formed therein. Each electronic device has a plurality of terminals 588 at an upper surface 590 of the first wafer 32A. When bringing the backing board 74 and the first wafer 32A together, the first wafer 32A is aligned with the backing board 74 to ensure that each one of the terminals 588 makes contact with a respective one of the contacts 562.

A vacuum pressure is created in an area between the upper surface 590 and the lower side 526 while a pressure below a lower surface 592 of the thin chuck 72 and an upper surface 594 of the circuit board 500 remain at atmospheric pressure. The pressure differential creates equal and opposing forces F1 and F2 on the circuit board 500 and thin chuck 72.

Figure 8B:
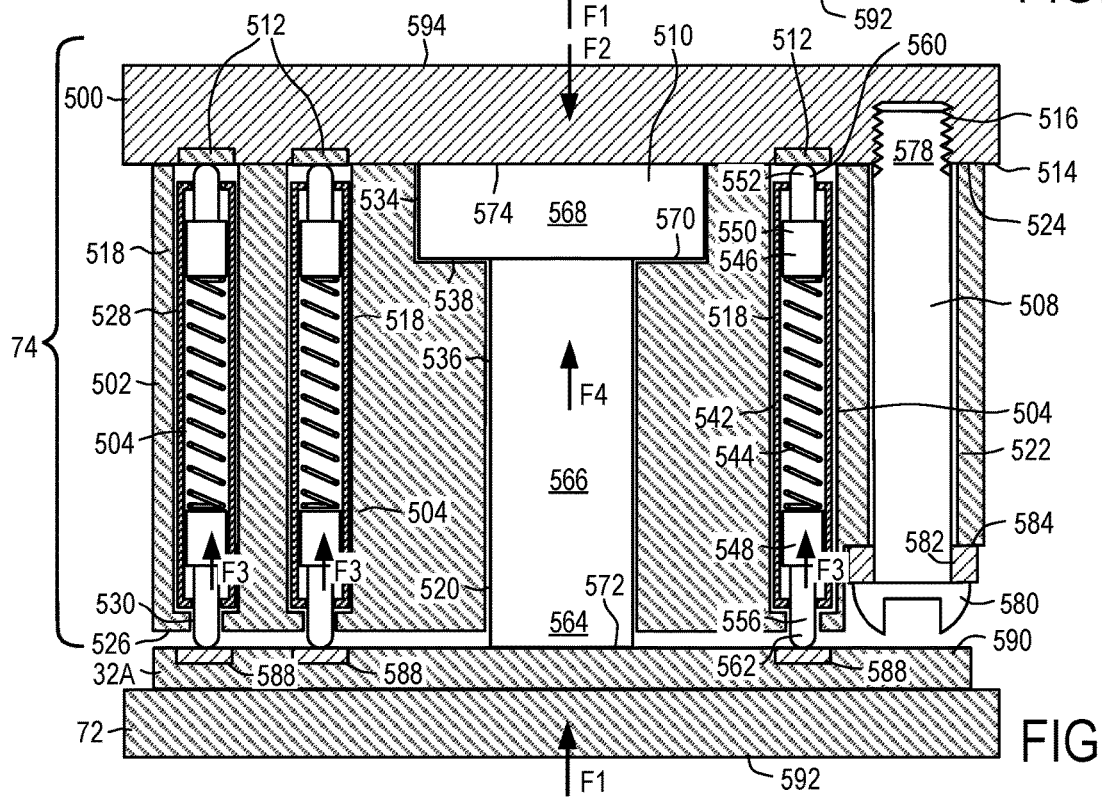

As shown in FIG. 8B, the forces F1 and F2 move the backing board 74 relatively towards the wafer 32A and the thin chuck 72. The coil springs 544 compress more to allow for the second end piece 548 to move into the pin opening 518. Each coil spring 544 is deformed against a spring force thereof, for example F3. The force F1 is, however, still more than the total of all the forces F3 added together. The upper surface 590 eventually comes to rest against the surface 572 of the stand-off 564. Because the post 510 abuts against the circuit board 500, the stand-off 564 prevents the upper surface 590 to move closer and into contact with the lower side 526 of the contactor 502. The first wafer 32A transfers a forces F4 onto the stand-off 564. The force transfer portion 566 transfers the force F4 through the second section 536 of the post opening 520. The force delivery portion 568 receives the force F4 from the force transfer portion 566 and delivers the force F4 via the surface 574 to the circuit board 500.

It can thus be seen that the force F4 is not carried by contactor 502, thereby preventing stresses that could cause damage to the brittle ceramic material of the contactor 502. Instead, the force F4 is transferred directly from an electronic device in the form of the first wafer 32A through the post 510 onto the circuit board 500.

In the embodiment described in FIGS. 8A and 8B, the contactor 502 serves as a supporting board having a post opening 520 therethrough. The circuit board 500 serves as a backing structure, on a first side of the supporting board, and including at least a circuit board having a contact 512. The pin 504 serves as a conductor having a contact 562 to make contact with a terminal 588 on an electronic device positioned on a second side of the supporting board opposing the first side of the supporting board. The retainer portion 542 serves as a portion of the conductor that is held by the supporting board. The conductor further has a terminal 560 that is connected to the contact 512 on the circuit board 500. A spring in the form of the coil spring 544 is provided. The thin chuck 72 serves as a force generation device on a side of the electronic device in the form of the first wafer 32A opposing the supporting board. The force generation device and the supporting board are moveable relative to one another to move the electronic device closer to the supporting board and to deform the spring. The post 510 has a stand-off 564 with a surface 572 in a plane spaced from a plane of a surface of the supporting board to prevent movement of the electronic device closer to the supporting board, a force transfer portion 566 extending from the stand-off 564 at least partially through the post opening 520 and a force delivery portion 568 extending from the force transfer portion 566, the force delivery portion 568 being held by the backing structure.

FIG. 9A illustrates a portion of the tester apparatus 10 that is used for insertion of a cartridge into each slot assembly, for example into the slot assembly 18A, and removal therefrom. The components of the tester apparatus 10 shown in FIG. 9A include a frame 300, a portion of the first slot assembly 18A, the first slot assembly interface 40, a holding structure 302, a horizontal transportation apparatus 304, a vertical transportation apparatus 306, a beam spring 308, and a locking mechanism 310.

The frame 300 includes first and second mounts 312 and 314 that are spaced from one another. The horizontal transportation apparatus 304 is a slide that is mounted between the first and second mounts 312 and 314. The holding structure 302 is mounted for sliding movement along the horizontal transportation apparatus 304. Opposing ends of the beam spring 308 are mounted to the first and second mounts 312 and 314 respectively.

The locking mechanism 310 includes a connection lever 316, a control lever 318 and a pressure lever 320. The control lever 318 is mounted to the first mount 312 on a pivot connection 322. The vertical transportation apparatus 306 is a rigid beam. A connection 324 connects center points of the vertical transportation apparatus 306 and the beam spring 308 to one another. The pressure lever 320 has a first link 326 rotatably connected to the control lever 318 and a second link 328 rotatably connected to an end of the vertical transportation apparatus 306. In the unlocked configuration shown in FIG. 9A, a line 330 connects the pivot connection 322 with the second link 328 and the first link 326 is to the left of the line 330.

In use, the first cartridge 28A is located on the holding structure 302. The first cartridge 28A is then moved together with the holding structure 302 from left to right into the first slot assembly 18A. The placement and movement of the first cartridge 28A may be manually executed or may be executed using a robot.

The holding structure 302 slides along the horizontal transportation apparatus 304. The connection lever 316 connects an end of the control lever 318 to the holding structure 302. When the holding structure 302 moves in a horizontal direction along the horizontal transportation apparatus 304, the connection lever 316 rotates the control lever 318 in a counterclockwise direction about the pivot connection 322.

The first link 326 rotates together with the control lever 318 in a counterclockwise direction. The pressure lever 320 translates movement of the first link 326 to downwards movement of the second link 328. At first, the downward movement is minimal, but when the first cartridge 28A is fully inserted into the first slot assembly 18A, vertical movement becomes more pronounced and the vertical transportation apparatus 306 engages the first cartridge 28A with the first slot assembly 18A. The horizontal transportation apparatus 304 is thus operable to move the first cartridge 28A horizontally from a first position to a second position into the first slot assembly 18A and the vertical transportation apparatus 306 is operable to move the first cartridge 28A and the first slot assembly 18A in a first vertical direction relative to one another to engage the slot assembly interface 40 with a cartridge interface on the first cartridge 28A.

Figure 10:
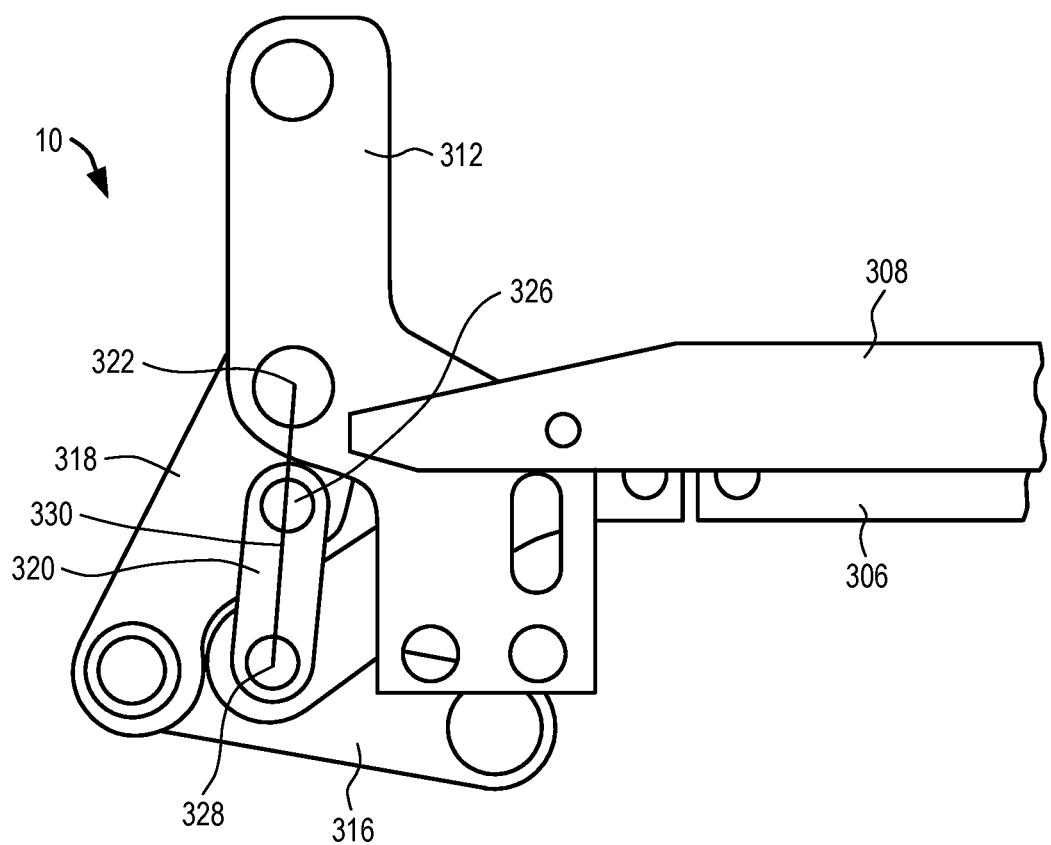

The control lever 318 is shown in an unlocked position in FIG. 9A where the first link 326 is on a first side of the line 330 connecting the pivot connection 322 and the second link 328. The control lever 318 rotates from the unlocked position shown in FIG. 9A through a compression position where the beam spring 308 is deformed by the vertical transportation apparatus 306 through the connection 324 by bending the beam spring 308 against a spring force thereof and the first link 326 is in line with the pivot connection 322 and the second link 328. The control lever 318 continues to rotate from the compressed position to a locked position as shown in FIGS. 9B and 10. In the locked position, the first link 326 is on the right of the line 330, and therefore on a second side of the line 330 opposing the first side. Because the first link 326 has passed through the line 330, and the beam spring 308 has deformed against a spring force thereof, the first cartridge 28A is locked in position against the slot assembly interface 40.

The system can be unlocked by moving the holding structure 302 from right to left. The control lever 318 rotates in a clockwise direction and the first link 326 moves right to left past the line 330. The vertical transportation apparatus 306 moves in an upward direction, i.e. a second vertical direction opposing the first vertical direction, to release the first cartridge 28A from the slot assembly interface 40. Further movement of the holding structure 302 along the horizontal transportation apparatus 304 removes the first cartridge 28A from the first slot assembly 18A.

Figure 11:
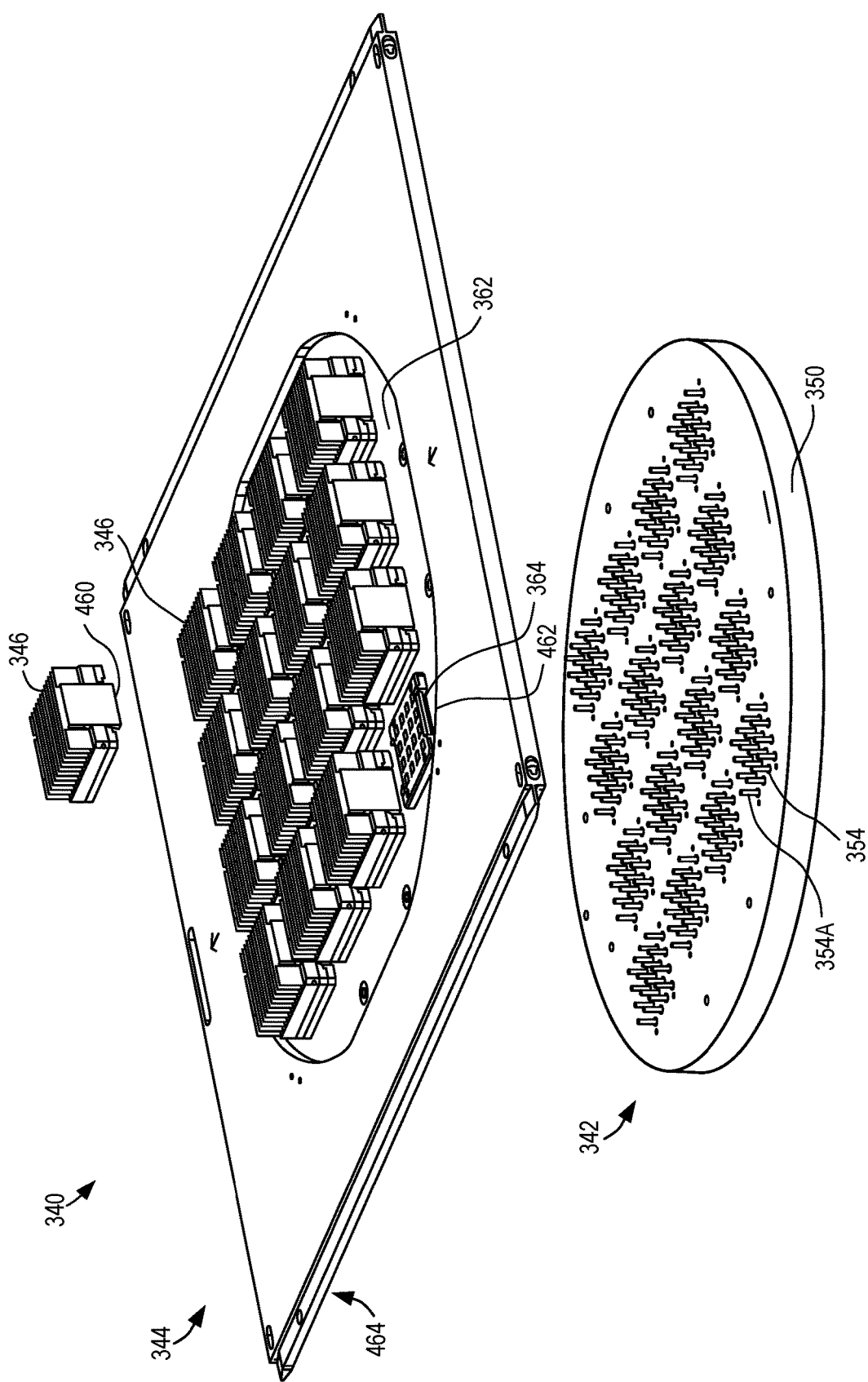
FIG. 11 is a perspective view illustrating a cartridge according to another embodiment of the invention.

FIG. 11 illustrates a cartridge 340, according to a further embodiment of the invention, including a thermal subassembly 342, a board-and-socket subassembly 344, and a plurality of lids 346.

Figure 12:
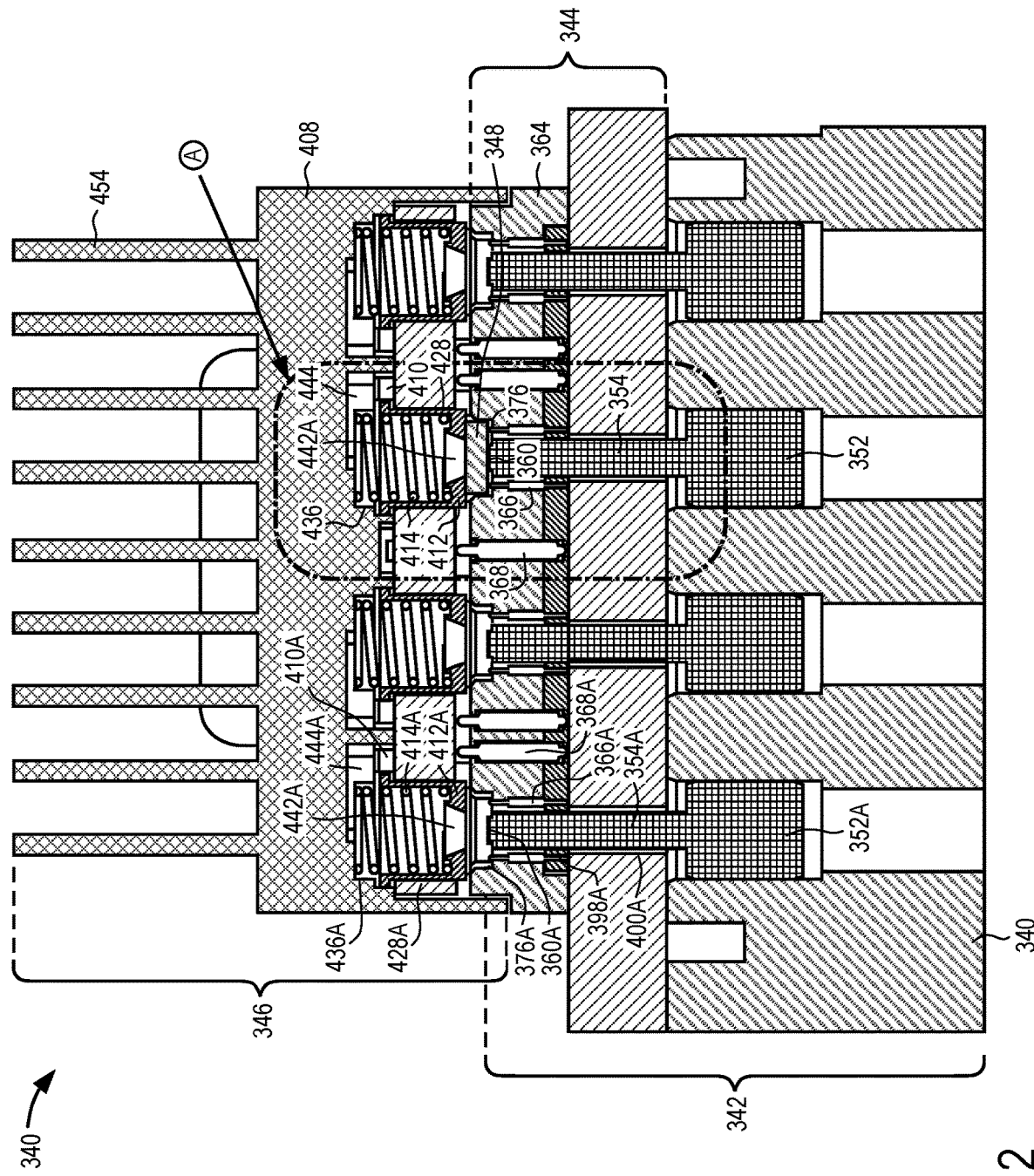
FIG. 12 is a cross-sectional side view of a portion of the cartridge in FIG. 11.

FIG. 12 shows a portion of the thermal subassembly 342, a portion of the board-and-socket subassembly 344 and one of the lids 346.

Figure 13:
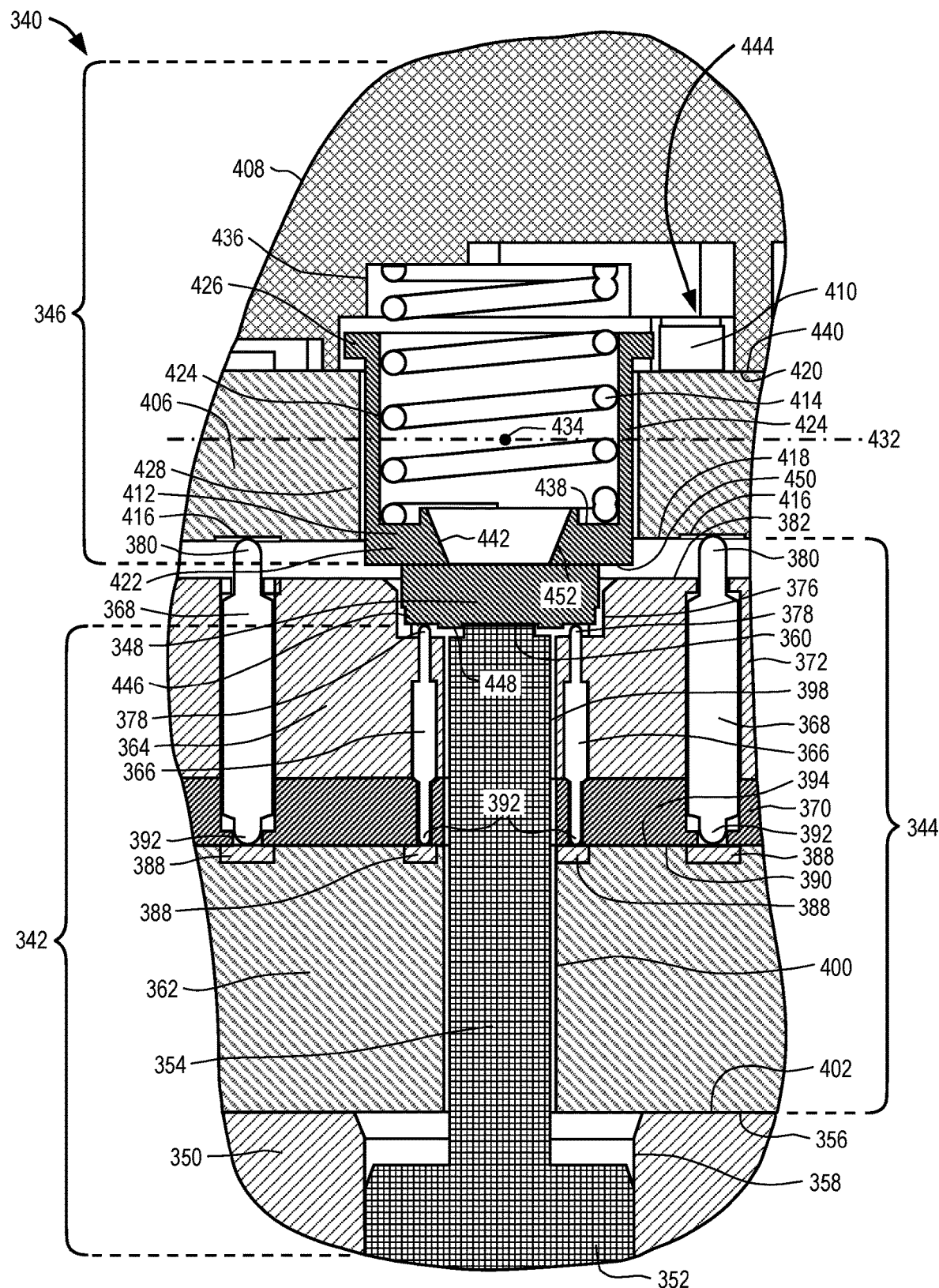
FIG. 13 is a cross-sectional side view illustrating details of a portion of the view of FIG. 12.

FIG. 13 shows detail A in FIG. 12, including a portion of the thermal subassembly 342, a portion of the board-and-socket subassembly 344 and a portion of the lid 346. FIG. 13 further illustrates a first electronic device 348.

The thermal subassembly 342 includes a thin chuck 350, a first thermal anchor 352, and first thermal post 354. The thin chuck 350 has an upper surface 356 with an opening 358 formed into the upper surface 356. The first thermal anchor 352 and first thermal post 354 are machined out of a single piece of metal. The first thermal anchor 352 and first thermal post 354 both have circular cross-sections in respective planes parallel to an axis of the first thermal post 354 when viewed in plan view. The cross-section of the first thermal anchor 352 is larger than the cross-section of the first thermal post 354.

The first thermal anchor 352 is inserted through the upper surface 356 into the opening 358. The first thermal post 354 extends upwardly from the first thermal anchor 352. A majority of the first thermal post 354 is located above the upper surface 356. The first thermal anchor 352 has an upper end with a first thermal surface 360. The first thermal anchor 352 is press fitted into the opening 358 up to a desired depth wherein the first thermal surface 360 is at a desired distance from the upper surface 356.

The first thermal post 354, first thermal anchor 352 and thin chuck 350 are all made of metals and therefore are good thermal conductors. The larger cross-section of the first thermal anchor 352, when compared to the cross-section of the first thermal post 354, results in more heat transfer from the first thermal anchor 352 to the thin chuck 350.

The board-and-socket subassembly 344 includes a circuit board 362, a socket 364, a first set of pins 366 for an electronic device, and a first set of pins 368 for a detector. The pins 366 and 368 are pogo pins that contain springs and can compress against spring forces of the springs.

The socket 364 includes a lower portion 370 and an upper portion 372. Each one of the pins 366 and 368 is retained within the socket 364 between the lower portion 370 and the upper portion 372. The upper portion 372 has a first recessed formation 376 for holding the first electronic device 348. Each one of the pins 366 has a respective contact 378 extending above a surface of the first recessed formation 376. Each one of the pins 368 has a respective contact 380 that extends above an upper surface 382 of the upper portion 372.

The contacts 380 of the pins 368 are all in the same plane. The contacts 378 of the pins 366 are all in the same plane. The plane of the contacts 380 is parallel and above the plane of the contacts 378. The terminals 392 of the pins 368 are all in the same plane as the terminals 392 of the pins 366.

The circuit board 362 has a circuit (not shown) formed therein. Contacts 388 are formed within an upper surface 390 of the circuit board 362.

The socket 364 is positioned on the circuit board 362. The circuit board 362 is thus located between the thin chuck 350 and the socket 364. Each one of the pins 366 and 368 has a respective terminal 392 that initially extends below a lower surface 394 of the lower portion 370. A respective one of the terminals 392 makes contact with a respective one of the contacts 388. The pins 366 and 368 are compressed against spring forces thereof until the lower surface 394 makes contact with the upper surface 390. The terminals 392 of the pins 366 and 368 move into the socket 364 until they are in the same plane as the lower surface 394. The socket 364 is then permanently mounted to the circuit board 362.

The socket 364 has a first socket thermal opening 398 formed from a lower side to an upper side therethrough. The circuit board 362 has a first circuit board thermal opening 400 formed from a lower side to an upper side therethrough. The first socket thermal opening 398 is aligned with the first circuit board thermal opening 400. The thermal subassembly 342 and the board-and-socket subassembly 344 are initially disconnected from one another as illustrated in FIG. 11. The board-and-socket subassembly 344 is then positioned over the thermal subassembly 342. The first circuit board thermal opening 400 is positioned over an upper end of the first thermal post 354. The board-and-socket subassembly 344 is then further lowered until the first thermal post 354 passes through the first socket thermal opening 398. A lower surface 402 of the circuit board 362 comes to rest on the upper surface 356 of the thin chuck 350. The first thermal post 354 fits loosely within the first socket thermal opening 398 and the first circuit board thermal opening 400. The first thermal post 354 extends above the upper surface 356 because it is slightly longer than the combined lengths of the first socket thermal opening 398 and the first circuit board thermal opening 400. The first thermal surface 360 is thus located slightly above an upper surface of the first recessed formation 376. The contacts 378 are, at this stage, located in a plane above a plane of the first thermal surface 360.

The socket 364 is made of an electrically and thermally insulative material. The pins 366 and 368 provide electric conductors through the socket 364. The circuit board 362 is also made of an electrically and thermally insulative material. The contacts 388 form part of an electric circuit within the insulative material of the circuit board 362. The first thermal post 354 provides a thermally conductive path between the first recessed formation 376 and the first thermal anchor 352 connected to the thin chuck 350. The first thermal post 354 is electrically and thermally insulated from the electric conductors within the socket 364 and the circuit board 362. Heat will conduct primarily through the first thermal post 354 as opposed to the insulative material of the socket 364 and the insulative material of the circuit board 362.

The lid 346 includes a circuit board 406 and a heat sink 408. The cartridge 340 further has a first light detector 410, a first adjustable component 412 and a first coil spring 414.

The circuit board 406 is made of an electrically and thermally insulative material. Electrically conductive terminals 416 are formed on a lower surface 418 of the circuit board 406. The terminals 416 form part of a circuit (not shown) that is formed within the circuit board 406.

The first light detector 410 is attached to an upper surface 420 of the circuit board 406. The first light detector 410 is connected to the terminals 416 through the circuit in the circuit board 406. One of the terminals 416 may, for example, provide power to the first light detector 410. When light falls on the first light detector 410, the first light detector 410 coverts the energy of the light to output electric power. The other terminal 416 can serve as an output contact connected to the first light detector 410 to measure the output electric power.

The first adjustable component 412 has a pusher plate 422, sidewalls 424 extending upwardly from the pusher plate 422, and a lip 426 extending outwardly from the sidewalls 424. The circuit board 406 has a first opening 428 formed therein. The first adjustable component 412 is inserted into the first opening 428. The pusher plate 422 then extends below the lower surface 418. The lip 426 comes to rest on the upper surface 420. The first opening 428 is slightly larger than a width between the sidewalls 424. The difference in widths allow the first adjustable component 412 to rotate about a first axis 432 relative to the circuit board 406 by a small amount of only a few degrees. The difference in widths also allows the first adjustable component 412 to rotate clockwise and counter clockwise about a second axis 434, which is into the paper and orthogonal to the first axis 432, relative to the circuit board 406. Such orthogonal rotation allows for a small amount of gimbaling of the first adjustable component 412 relative to the circuit board 406.

The heat sink 408 has a first recess 436. The first coil spring 414 is inserted between the sidewalls 424. A lower end of the first coil spring 414 rests on an upper surface 438 of the pusher plate 422. An upper end of the first coil spring 414 extends above the lip 426. The heat sink 408 is located over the circuit board 406 with the upper end of the first coil spring 414 positioned within the first recess 436. A lower surface 440 of the heat sink 408 is initially spaced from the upper surface 420. The first coil spring 414 compresses and is thus deformed against a spring force thereof when the heat sink 408 is moved towards the circuit board 406. The lower surface 440 comes into contact with the upper surface 420. The heat sink 408 is then secured to the circuit board 406 with fasteners (not shown). A small force created by the first coil spring 414 then biases the first adjustable component 412 is a direction out of the lower surface 418.

The pusher plate 422 has a first opening 442 therein. The heat sink 408 defines a first cavity 444. A light absorbing coating is formed on surfaces of the first cavity 444.

In use, the first electronic device 348 is inserted into the first recessed formation 376. Terminals 446 on a lower side of the first electronic device 348 make contact with the contacts 378. A lower surface 448 of the first electronic device 348 is, at this stage, spaced from the first thermal surface 360.

The lid 346 is positioned over the board-and-socket subassembly 344. The lid 346 is then moved towards the board-and-socket subassembly 344. Each one of the terminals 416 comes into contact with a respective one of the contacts 380. A lower surface 450 of the pusher plate 422 comes into contact with an upper surface 452 of the first electronic device 348. The lower surface 448 of the first electronic device 348 is still spaced from the first thermal surface 360.

An operator manually presses, and thereby moves the lid 346 further towards the board-and-socket subassembly 344. Each one of the pins 366 and 368 compresses against spring forces thereof, thus resiliently depressing the contacts 378 and 380 against the spring forces of the springs in the pins 366 and 368. The lower surface 448 of the first electronic device 348 comes into contact with the first thermal surface 360.

If there is an angular misalignment between the first thermal surface 360 and the lower surface 448 of the first electronic device 348, the first electronic device 348 is rotated by the first thermal surface 360 until the lower surface 448 is in the same plane as the first thermal surface 360. The rotation of the first adjustable component 412 relative to the lid 346 allows for seating of the lower surface 448 of the first electronic device 348 against the first thermal surface 360. Good thermal contact between the first thermal surface 360 and the lower surface 448 is thereby ensured. The first coil spring 414 compresses to accommodate a height of the first electronic device 348. Additionally, the first adjustable component 412 is rotatably mounted to the lid 346 so that the first electronic device 348 can rotate the first adjustable component 412 relative to the first thermal surface 360. The lid 346 is then secured to the board-and-socket subassembly 344.

The socket 364 and the lid 346 jointly form an electronic device holder holding the first electronic device 348. A cartridge interface (not shown) on the circuit board 362 provides power and communication to and from the contacts 388. The pins 366 provide power and communication to the first electronic device 348 via the terminals 446.

The first electronic device 348 may, for example, include a laser or other light transmitter. The first electronic device 348 may, for example, have a laser transmitter in the upper surface 452 thereof. When power and communication are provided to one of the contacts 378 serving as an input contact and one of the terminals 446 serving as an input terminal, the laser transmitter of the first electronic device 348 transmits laser light through the first opening 442 and through the first coil spring 414 and the sidewalls 424 into the first cavity 444.

A majority of the light is absorbed by the light absorbing material on the surfaces of the first cavity 444, and thus converted to heat. The heat conducts through the heat sink 408.

A small percentage of the light reflects off the surfaces of the first cavity 444 and is detected by the first light detector 410. The first light detector 410 is powered through an electric conductor formed by one of the contacts 388, one of the pins 368, one of the terminals 416 and a circuit formed within the circuit board 406. When the first light detector 410 detects the light, it converts the light to electric power. The magnitude of the electric power is in relation to the magnitude of the light detected by the light detector 410. The first light detector 410 then provides the electric power to the circuit board 362 via a conductor that is formed jointly by a circuit in the circuit board 406, one of the terminals 416, one of the pins 368, one of the contacts 388 and ultimately to the cartridge interface on the circuit board 362.

The circuit board 406 and the pins 368 provide a measurement channel connecting the first light detector 410 to the circuit board 362, even though the first light detector 410 is on an opposite side of the first electronic device 348 than the circuit board 362. In a similar fashion, another type of detector, other than a light detector, may be used to detect features of an electronic device other than light transmitted by the electronic device. It may, for example, be possible to detect a current on a terminal on an upper surface of an electronic device and create a similar measurement channel via a circuit board above the electronic device and a pin located in a socket to a circuit board below the electronic device. In such an arrangement, a pin such as the pin 368 can serve as a detector measurement pin held by a socket and forming part of the measurement channel.

A temperature of the first electronic device 348 is controlled by conducting heat through the first thermal post 354. The first electronic device 348 may, for example, be heated or cooled through the first thermal post 354. The first electronic device 348 can, for example, be cooled by transferring heat from the first electronic device 348 through the first thermal post 354 and the first thermal anchor 352 to the thin chuck 350. The first electronic device 348 can be heated by transferring heat from the thin chuck 350 through the first thermal anchor 352 and the first thermal post 354 to the first electronic device 348.

The thin chuck 350 is on a side of the first electronic device 348 opposing the heat sink 408. It can thus be seen that the temperature of the first electronic device 348 can be controlled independently from heat dissipation by the heat sink 408 due to laser light transmitted by the first electronic device 348.

Referring again to FIG. 12, a plurality of electronic devices can be tested using one socket 364 and one lid 346. The socket 364, for example, includes a second thermal anchor 352A, a second thermal post 354A, a second thermal surface 360A, a second set of pins 366A for a second electronic device, a second set of pins 368A, a second recessed formation 376A for the second electronic device (not shown), a second socket thermal opening 398A, a second circuit board thermal opening 400A, a second light detector 410A, a second adjustable component 412A, a second coil spring 414A, a second opening 428A, a second recess 436A, a second opening 442A, and a second cavity 444A. Like reference numerals indicate like components and functioning.

Light transmitted by the first and second electronic devices can be detected independently by the first and second light detectors 410 and 410A. Heat, due to the light of the first and second electronic devices, is dissipated through the same heat sink 408. A plurality of fins 454 are connected to the heat sink 408 and extend therefrom. The heat conducts to the fins 454 and then convects from the fins 454 to the surrounding air. The fins 454 thus serve as a heat dissipation device thermally connected to the heat sink 408 to remove the heat from the heat sink 408.

The temperatures of the first and second electronic devices are jointly controlled through the same thin chuck 350. Should the electronic devices for example be cooled, heat conducts through the first and second thermal posts 354 and 354A to the first and second thermal anchors 352 and 352A, respectively, and then from the first and second thermal anchors 352 and 352A to the thin chuck 350.

The first and second electronic devices are independently rotatable to make contact with the first and second thermal surfaces 360 and 360A, respectively. Independent rotation of the first and second electronic devices is permitted and controlled by the independent gimbaling of the first and second adjustable components 412 and 412A relative to the lid 346.

Referring again to FIG. 11, sixteen sockets 364 are attached to the circuit board 362. Each socket 364 has a respective lid 346. Each lid 346 has a respective securing formation 460 and each socket 364 has a respective securing formation 462. The lid 346 is moved towards the socket 364. The lid 346 is then pressed on to the socket 364 as hereinbefore described. The securing formations 460 and 462 then engage with one another to secure the lid 346 to the socket 364 and maintain thermal and electrical integrity.

The thin chuck 350 has multiple thermal posts secured thereto in sixteen groups of sixteen. Each group of thermal posts is inserted through a respective one of the sockets 364. The electronic devices held by all sixteen sockets 364 are maintained at their temperatures using the single thin chuck 350.

A cartridge interface 464 is formed on a lower surface of the circuit board 362. The cartridge interface 464 is connected through a circuit (not shown) to the contacts 388 shown in FIG. 13. The cartridge interface 464 is used to connect the cartridge 340 to an electric tester as hereinbefore described. The thin chuck 350 is thermally connected to a thermal chuck as hereinbefore described. The thermal chuck serves as a temperature modification device to control heat being transferred to or form the thin chuck 350.

Following testing of the electronic devices, the cartridge 340 is removed from the system, the lids 346 are taken off and the electronic devices are removed from the sockets 364.

The thermal post 354 also serves as a post that transfers a force in a manner similar to the embodiment described in FIGS. 8A and 8B. The lid 346 serves as a force generation device. Some of the force created by the lid 346 is balanced by forces created by the springs within the pins 366 and 368. A remainder of the force that is not balanced by the pins 366 and 368 is taken up by a stand-off of the post 354 having the surface 360 to support the electronic device 348 and to prevent movement of the electronic device 348 closer to a base of the recessed formation 376. A central portion of the post 354 serves as a force transfer portion extending from the stand-off through the opening 398. The circuit board 362 and the thin chuck 350 jointly form a backing structure. A lower portion of the post 354 delivers the force to the backing structure in general. Specifically, the force is delivered through the thermal anchor 352 to the thin chuck 350 forming part of the backing structure. A press fit between the thermal anchor 352 and the thin chuck 350 is strong enough to remain in tact so that the force does not cause the thermal anchor 352 to move relative to thin chuck 350.

Figure 14A:
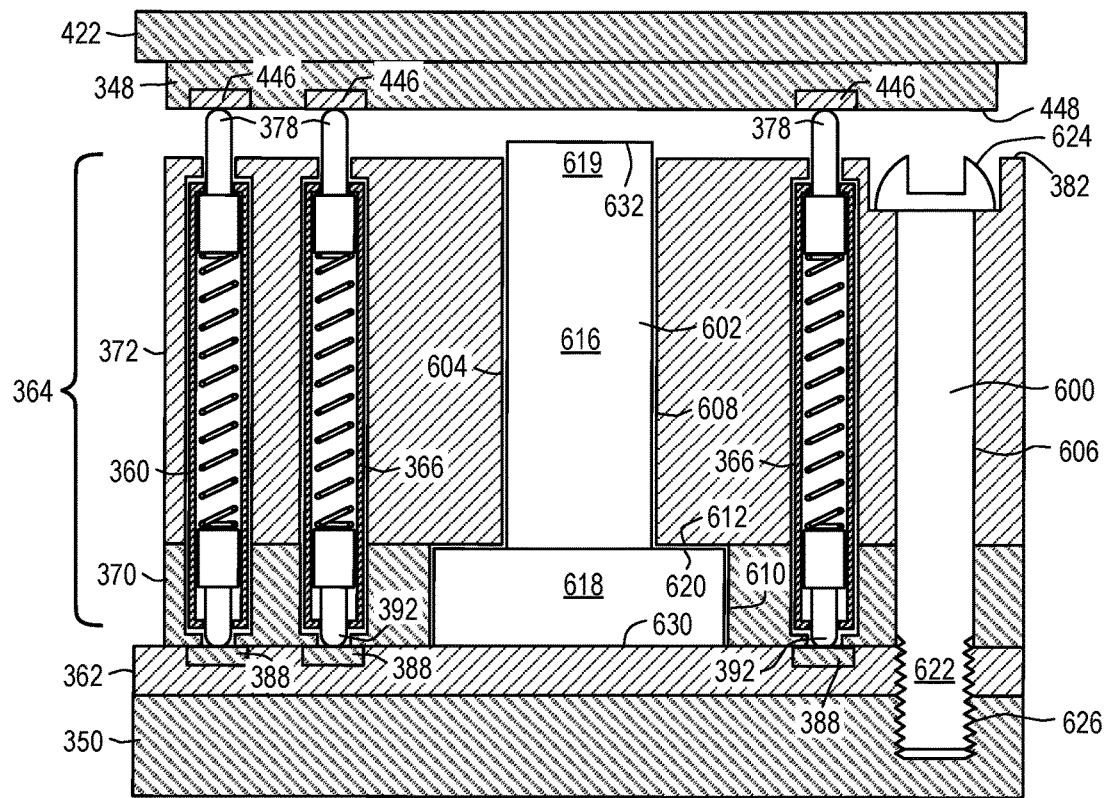
FIGS. 14A and 14B are cross-sectional side views illustrating the use of a stand-off in the configuration of FIGS. 11-13.

FIG. 14A illustrates the embodiment of FIGS. 11, 12 and 13, further illustrating details thereof including a fastener 600 and a post 602.

A post opening 604 and a fastener opening 606 are formed through the socket 364. The post opening 520 has a first section 608 and a second section 610. The second section 610 is wider than the first section 608. The first section 608 may, for example, be formed though the upper portion 372 and the second section 610 may be formed through the lower portion 370. A landing 612 connects the first section 608 to the second section 610.

The post 602 includes a stand-off 614, a force transfer portion 616 and a force delivery portion 618. The post 602 is inserted from the bottom into the post opening 604 until a surface 620 of the force delivery portion 618 abuts against the landing 612. A threaded shaft 622 of the fastener 600 is inserted from the top through the fastener opening 606. A head 624 is then rotated so that thread on the threaded shaft 622 screws into thread in a threaded opening 626 in the thin chuck 350. Because the thin chuck 350 is made out of metal it provides a good anchor for the fastener 600. As the fastener 600 is further turned, the head 624 moves closer to the circuit board 362. The springs of the pins 366 compress slightly and a lower side 630 of the post 602 comes into contact with the circuit board 362.

Figure 14B:
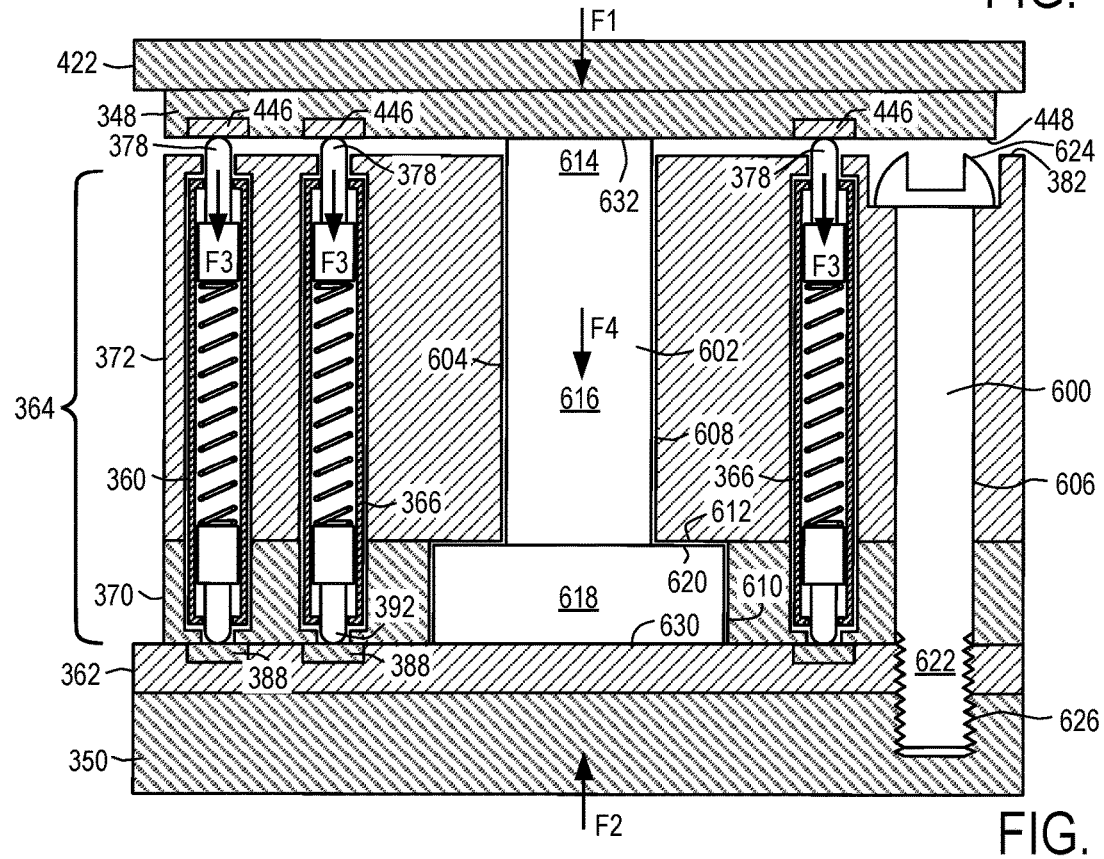

As shown in FIG. 14B, when the operator presses the lid 346 onto the socket 364, the pusher plate 422 creates a force F1 that is equal and opposite to a reactive force F2 that is created in the thin chuck 350. The springs of the pins 366 compress against spring forces F3 thereof. The pusher plate 422 and the first electronic device 348 continue to move closer to the socket 364 until the lower surface 448 of the electronic device 348 comes into contact with a surface 632 of the stand-off 614. The surface 632 prevents further movement of the electronic device 348 towards the socket 364.

The stand-off 614 receives a force F4 from the electronic device 348. The force transfer portion 616 transfers the force through the first section 608 of the post opening 604. The force delivery portion 618 receives the force from the force transfer portion 616 and delivers the force to the circuit board 362. The circuit board 362 delivers the force to the thin chuck 350.

It can thus be seen that the material of the socket 364 is not exposed to the force F4 and damage to the socket 364 can thereby be eliminated.

The socket 364 provides a supporting board having a post opening 604 therethrough. The circuit board 362 provides a backing structure, on a first side of the supporting board, and has a contact 388. The pin 366 forms a conductor having a contact 378 to make contact with a terminal 446 on an electronic device 348 positioned on a side of the supporting board opposing the first side of the supporting board. The conductor has a portion held in the supporting board and a terminal 392 connected to the contact 388 on the circuit board 362. A spring is provided within the pin 366. The pusher plate 422 forms a force generation device on side of the electronic device 348 opposing the supporting board. The force generation device and the supporting board are moveable relative to one another to move the electronic device 348 closer to the supporting board and deform the spring. The post 602 has a stand-off 614 with a surface 632 in a plane spaced from a plane of a surface of the supporting board to prevent movement of the electronic device 348 closer to the supporting board. The force transfer portion 616 extends from the stand-off 614 at least partially through the post opening 604. The force delivery portion 618 extends from the force transfer portion 616. The force delivery portion 618 is being held by the backing structure.

Figure 15:
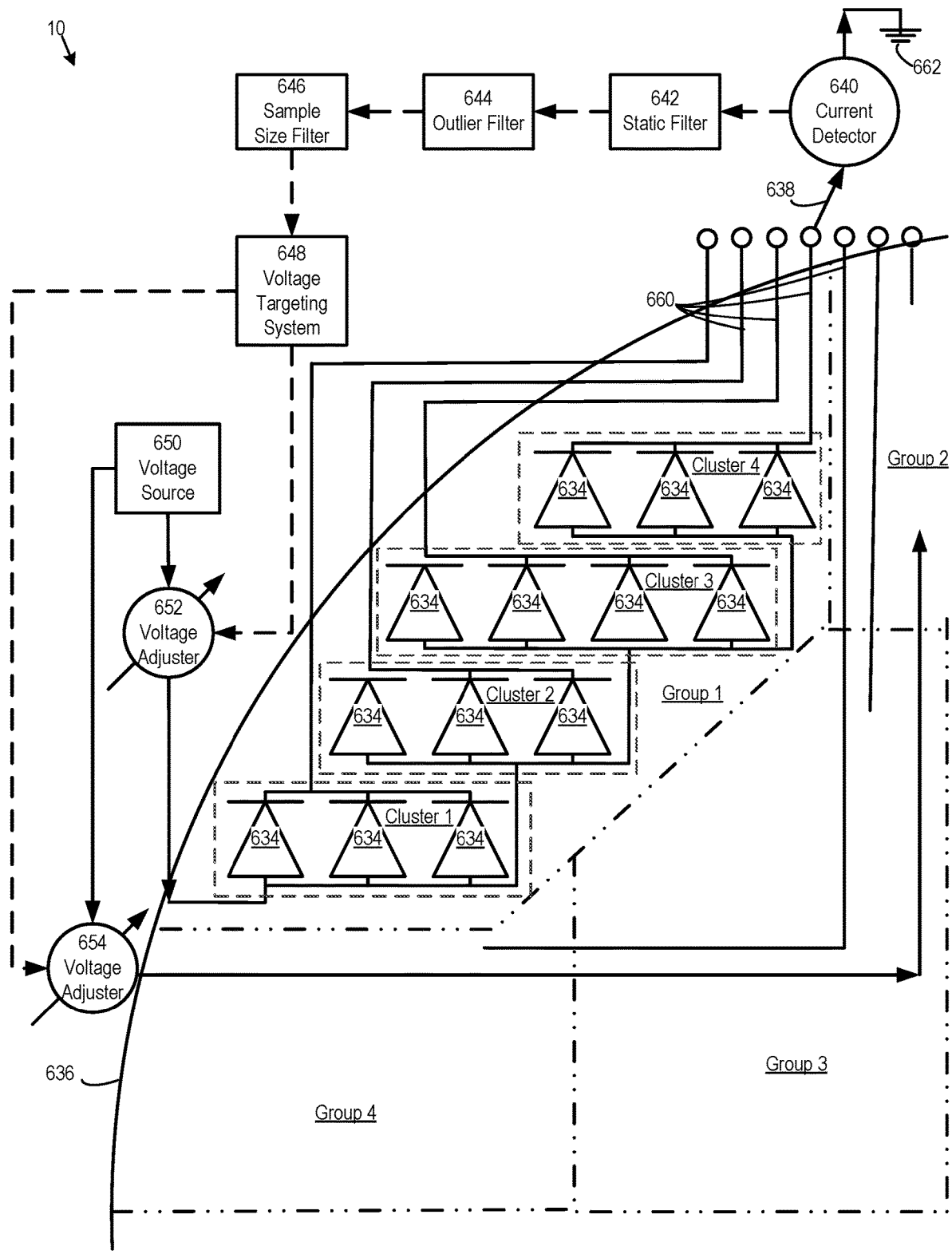
FIG. 15 illustrates components of the tester apparatus that are used to control voltages to individual electronic devices.

FIG. 15 illustrates further components of the tester apparatus 10 that are used to accurately control voltages that are supplied to electronic devices 634 that are being subjected to testing. The electronic devices 634 may, for example, be located across the surface of a wafer 636 or may be individual devices that are held within a layout of sockets.

Many semiconductor devices need a constant current supply versus a constant voltage supply. An example of this is the burn-in (or aging) of Vertical Cavity Surface Emitting Lasers (VCSEL) wafers. The following challenges present themselves:

A VCSEL wafer has a very large number of devices in a very small area. For example, assume a VCSEL wafer with 50,000 devices in a 3 inch circle.

The cost of 50,000 constant current sources would make the system price too high for cost-effective burn-in.

Routing 50,000 power lines into a 3 inch circle would be extremely difficult, if not impossible.

For purposes of further explanation, the following assumptions can be made:

VCSELs are diodes, and as such, rarely have power to ground shorts.

"Opens" can occur at a much higher frequency due to either VSCELS being "open" or due to a bad contact to the wafer.

The internal resistance of a VCSEL is significant (about 100 ohms for a 10 mA VCSEL) and is VERY consistent (within 1%) across a wafer.

It is very possible to build voltage sources which are very accurate (within 1%).

It is possible to measure the current fairly accurately for a voltage source.

Most VCSEL wafers have a common cathode that limits the ability to place VCSELs in series.

For illustration, assume:

VCSEL burn-in requires about 2.5 Volts and 10 mA.

Assume a system with 1024 power channels with up to 5 Volts and 200 mA per channel.

Assume the system could provide constant current or constant voltage per channel.

Assume the goal is to burn-in ¼ wafer (12,500 VCSELs) in a single step.

The following is a list of existing burn-in circuit options:
(1) Individual Constant Current Sources. This gives precise, measurable current to every VCSEL, but presents the following problems:
   Only about 2% of the wafer can be burned-in per step (1024 channels versus 50,000 devices).
   The "cost" per VCSEL is 1 channel. Even if additional channels could be added, the cost would remain 1 channel per VCSEL.
   Even if the system could be expanded to 12,500 channels (the minimum number of channels required to burn-in ¼ of the wafer) it would be impossible or cost prohibitive to route 12,500 power channels into the 3 inch wafer area.
(2) Series wiring. This would require placing about 13 VCSELs in series and driving with a constant current source, but presents the following problems:
   Since VCSELs all have a common cathode, it is not possible to wire a wafer of VCSELs in series.
   This would require a current source of 10 mA and over 30 Volts. Protecting such a high voltage against current surges is very difficult.
(3) Parallel wiring with current source. Drive about 13 VCSELs in parallel with a constant current source. This would require a 2.5 Volt, 130 mA current source. This system presents the following problems:
   For every VCSEL that has an "open" or bad probe contact, the extra current gets distributed among the rest of the VCSELs in the group. Thus, each VCSEL would get about an extra 8% current (130 mA/12 VCSELs) for every bad VCSEL in a group.
   If the voltage does not shift significantly due to the open VCSEL, it will not be known that the other 12 VCSELs received the wrong burn-in current and thus bad devices might escape detection.
(4) Parallel wiring with a voltage source. Such a system would drive 13 VCSELs in parallel with a constant voltage source. The voltage source is chosen to be the required voltage for all 13 VCSELs to receive 10 mA of current. This system presents the following problems:
   If a VCSEL is open, then the total current in the group will be a little less. For every open VCSEL, the group current will be 10 mA lower (for example, 140 mA for the group versus 150 mA.) The rest of VCSELs in the group will still get 10 mA.
   The stability of the current per VCSEL in the group is very good. In the worst case it is the accuracy of the voltage supply (<1%) and the consistency of the internal resistance of a good VCSEL (<1% across a wafer.) Thus, the current through each VCSEL will be consistent to within 2% across the wafer using a parallel voltage source.
   If a VCSEL were to have a short (highly unlikely), then the over-current protection on the power channel would shut down that power channel, leaving the other channels still operating.

Existing solutions can thus be summarized as follows:
Circuit 1 is the ideal circuit, but cost and technical issues exclude it.
Circuit 2 is not possible on a common cathode VCSEL wafer.
Circuit 3 gives very poor results in the most common failure mode, "open" devices.
Circuit 4 gives very good results in almost all cases and is very cost-effective.

Circuit 4 (parallel wiring with a voltage source) presents the following problems:
   The correct voltage needs to be chosen for the voltage source for the VCSELs to receive the proper current.
   The proper voltage is a function of several factors:
      VCSEL construction. The design of the VCSEL determines the voltage at the desired current.
      VCSEL fabrication process variations from wafer to wafer. Due to process variation, the voltage at a given current can vary from wafer to wafer.
      VCSEL fabrication process variations across a wafer. The voltage at a given current can vary from devices near the wafer edge from those at wafer center.
      The voltage at a specific current varies with temperature. Not only the heat being added for burn-in, but also the device's own internal heating can vary the voltage at a given current.
      As a VCSEL ages, its voltage/current relationship shifts. Thus even if the voltage was correct at the start of a burn-in cycle, the proper voltage at the end will likely be lower.

FIG. 15 only shows the electronic devices 634 of a first group (Group 1) of clusters (Clusters 1 to 4) of electronic devices 634 located in a region near an edge of the wafer 636. It should be understood that there are 16 groups (Groups 1 to 4) of clusters and each group has 64 clusters and each cluster has twelve electronic devices 634.

The electronic devices 634 of the first cluster (Cluster 1) are connected to one another in parallel, either through conductors forming part of the wafer 636 or by an external device forming part of the tester apparatus 10. Further clusters (Clusters 2 to 4) of electronic devices (not shown) are located in further regions of the first group (Group 1). Each cluster has a respective set of twelve electronic devices that are connected to one another in parallel. The electronic devices forming one cluster are not electrically connected to the electronic devices forming part of any other cluster.

The tester apparatus 10 includes a cluster selector switch 638, a current detector 640, a static filter 642, an outlier filter 644, a sample size filter 646, a voltage targeting system 648, a voltage source 650, and first and second voltage adjusters 652 and 654.

Each cluster provides a separate current output to the cluster selector switch 638. The cluster selector switch 638 is adjustable to selectably connect the current detector 640 to a respective one of the current outputs 660. Current from a respective current output 660 passes through the current detector 640 to ground 662.

The cluster selector switch 638 is typically operated to connect each one of the current outputs 660 to the current detector 640. The current detector 640 thus detects currents from each one of the clusters.

The current detector 640 provides an output to the static filter 642. The static filter 642 is adapted to remove a current reading for a respective cluster that is above or below set limits. The static filter 642 typically processes data for all of the clusters at the same time to remove data for clusters that have current readings that are above or below set limits.

The static filter 642 passes data to the outlier filter 644. The outlier filter 644 removes a current reading for a respective cluster that is too far or below a median for a group of the clusters. The outlier filter 644 passes data on to the sample size filter 646. The sample size filter 646 stops computing a mean for current readings for clusters that include the cluster if the number of channels (devices) for the cluster is too small.

The voltage source 650 is connected through the voltage adjuster 652 to input voltage terminals of the electronic devices 634 of the first group. The voltage source 650 is further connected through the voltage adjuster 654 to input terminals of the electronic devices of the second group. Similarly, the voltage source 650 is connected through further voltage adjusters (not shown) to the electronic devices of further ones of the groups.

The voltage targeting system 648 receives data from the sample size filter 646 and adjusts the voltage adjusters 652 and 654 based on the data.

Figure 16:
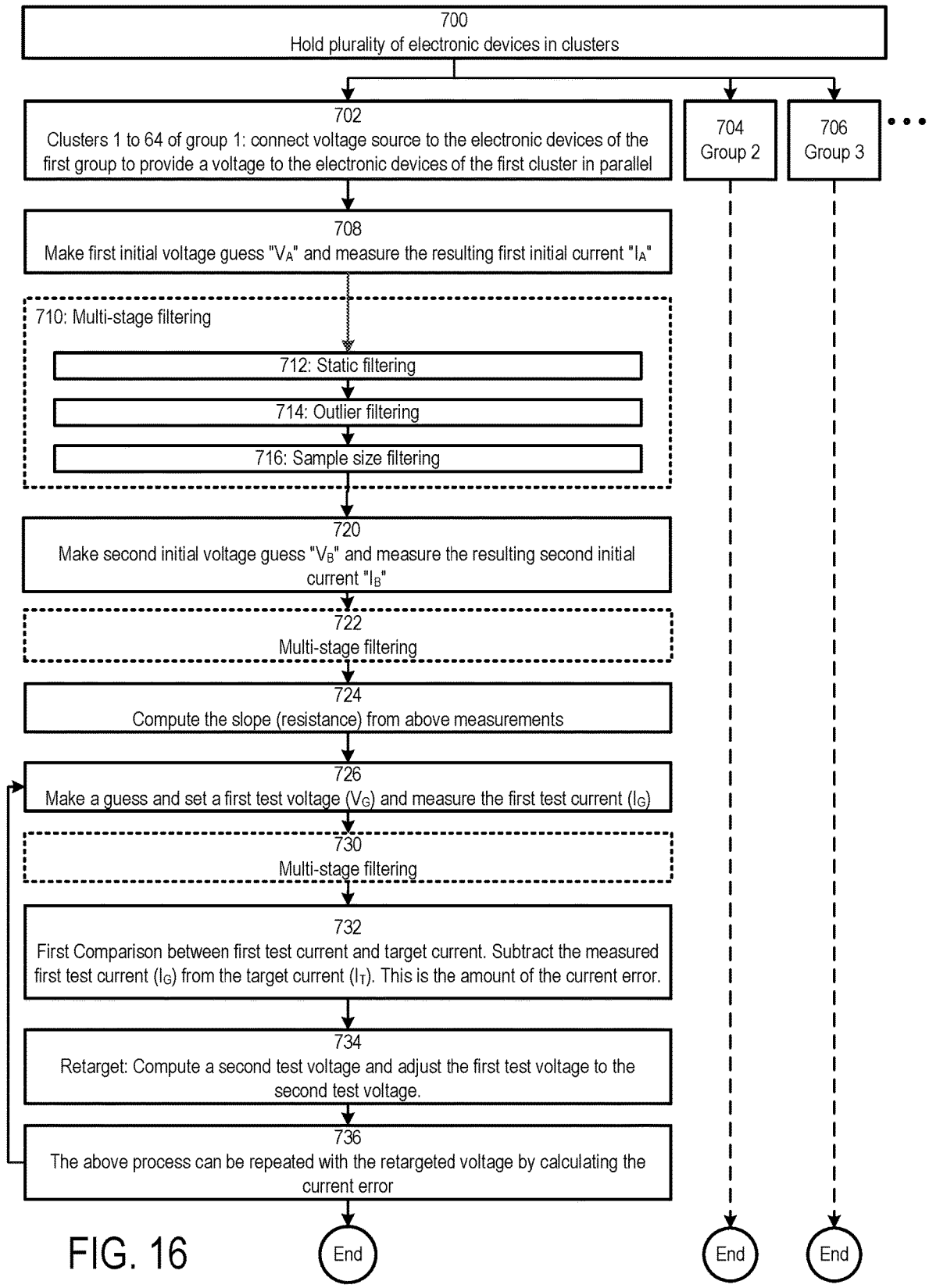
FIG. 16 is a flow chart illustrating the operation of the components in FIG. 15.

FIG. 16 illustrates a method of testing the plurality of electronic devices 634 using the components of the tester apparatus 10 in FIG. 15.

At 700, the plurality of electronic devices are held in clusters as described above. At 702, the voltage source 650 is connected to the electronic devices 634 of the first cluster. As described above, the voltage source 650 is connected to the electronic devices 634 to provide a voltage to the electronic devices 634 of the first cluster in parallel. At 704, the voltage source 650 is connected through the voltage adjuster 652 to the electronic devices of the second cluster to provide a voltage to the electronic devices of the second cluster in parallel. Similarly, at 706, the voltage source 650 is connected through the voltage adjuster 652 to the electronic devices of the third cluster to provide a voltage to the electronic devices of the third cluster in parallel. The voltage source 650 may similarly be connected through the voltage adjuster 652 to further clusters of the electronic devices to provide a voltage to the electronic devices of each cluster in parallel.

Figure 17:
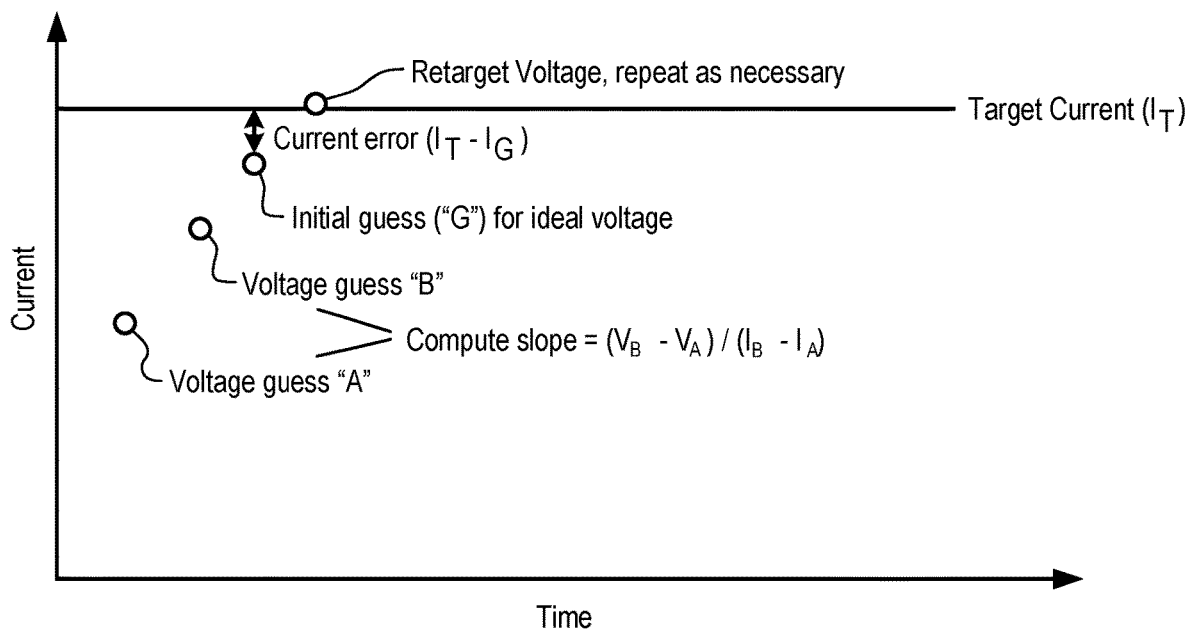
FIG. 17 is a graph illustrating the voltage retargeting following the process of FIG. 16.

Referring to FIG. 17, a slope of a curve is calculated by first determining voltage guesses "A" and "B". Steps 708 to 724 in FIG. 16 correspond to the calculation of the slope.

At 708, a first initial voltage guess "$V_A$" is made and a resulting first initial current "$I_A$" is measured using the current detector 640 in FIG. 15. The voltage source 650 in FIG. 15 provides the first initial voltage guess for electronic devices 634 of the first cluster in parallel. The second, third and further clusters receive similar treatment as the first cluster. For example, the voltage source 650 provides a first initial voltage guess for the electronic devices of the second cluster in parallel.

The cluster selector switch 638 in FIG. 15 is sequentially switched through the current outputs 660 from the respective clusters of the first group. When the cluster selector switch 638 is connected to the current output 660 of the first cluster, the current detector 640 measures the first initial current from the electronic devices 634 of the first cluster. The first initial current from the electronic devices 634 of the first cluster that is measured by the current detector 640 is a total current of the electronic devices 634 of the first cluster in parallel. When the cluster selector switch 638 is switched to the current output 660 of the second cluster, the second cluster receives similar treatment as the first cluster, as indicated by the dashed line between 704 and 710 in FIG. 16. Similarly, by continuing to switch the cluster selector switch 638 to subsequent current outputs 660, the current detector 640 measures a first initial current for the electronic devices of each respective cluster.

The current detector 640 provides the current measurements to the static filter 642 in FIG. 15. As more clearly seen in FIG. 16, multi-stage filtering 710 is carried out, which includes static filtering 712, outlier filtering 714, and sample size filtering 716. As shown in FIG. 16, the static filter 642 of FIG. 15 carries out static filtering at 712.

Figure 18A:
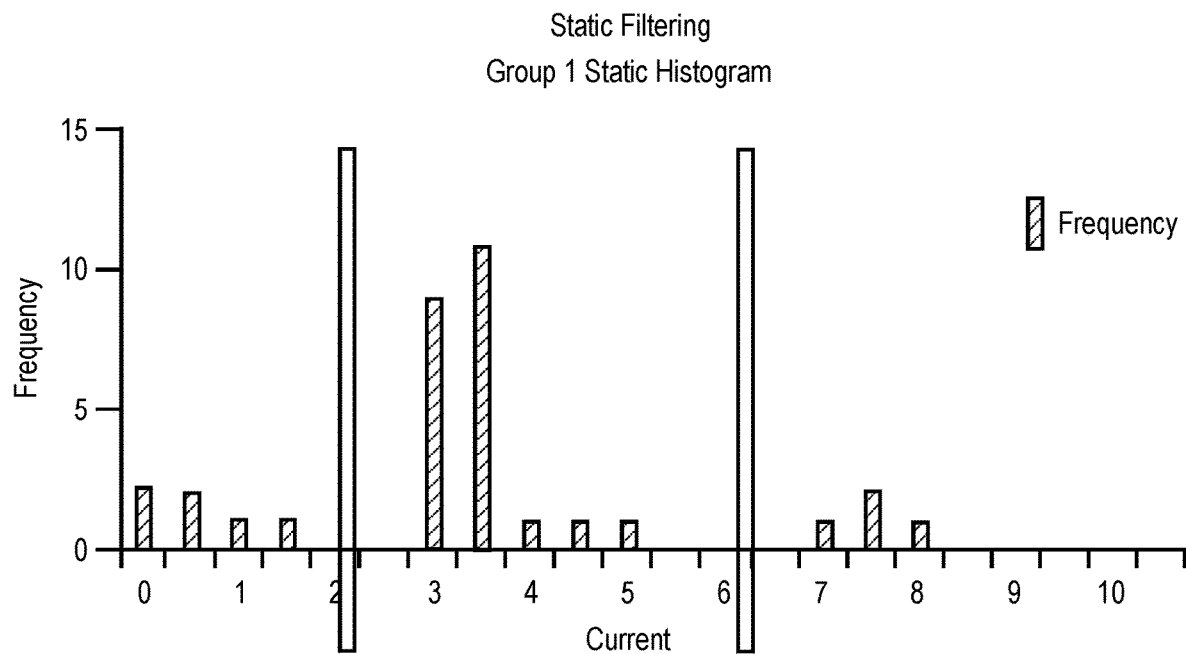
FIGS. 18A and 18B show histograms to illustrate static filtering that is carried out in FIG. 16.
Figure 18B:
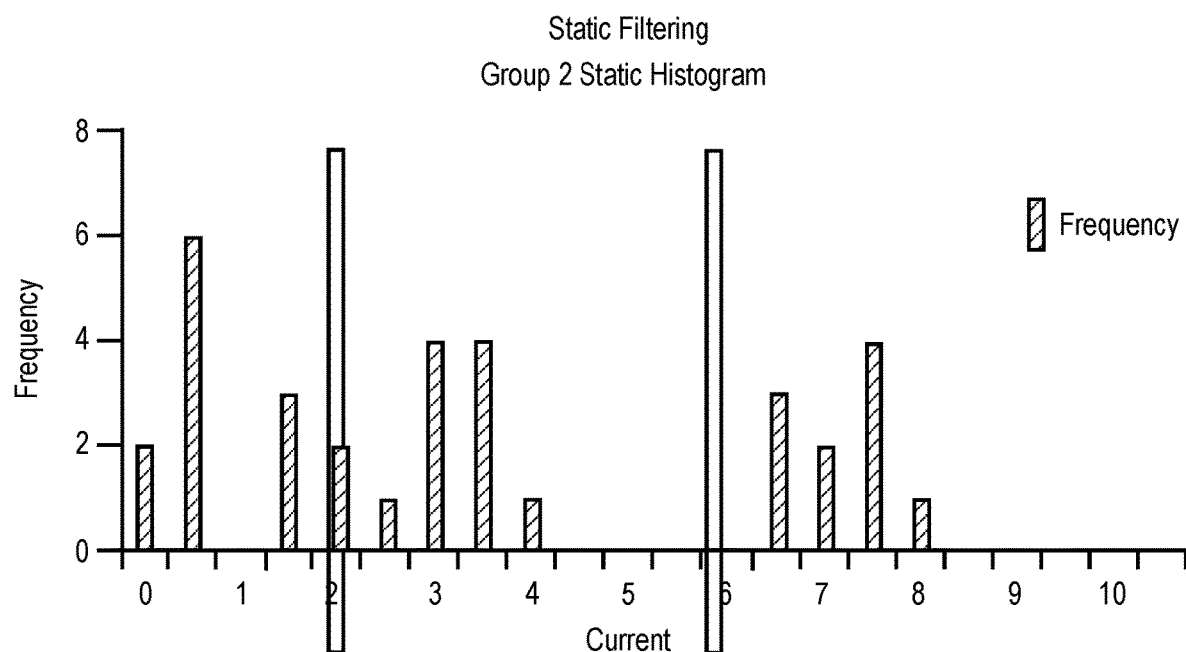

FIGS. 18A and 18B illustrate static filtering in more detail. Individual currents from the first and second groups are shown. Static filtering removes current readings above and below set limits; e.g., below 2 and above 6. Static filtering may for example remove a first initial current reading for a respective cluster in a respective group that is above and below set limits. Any given cluster might have an "open" VCSEL and thus not return a correct total current for all of the VCSELs. Current limits can be used to determine if any given reading appears to be correct.

Figure 19A:
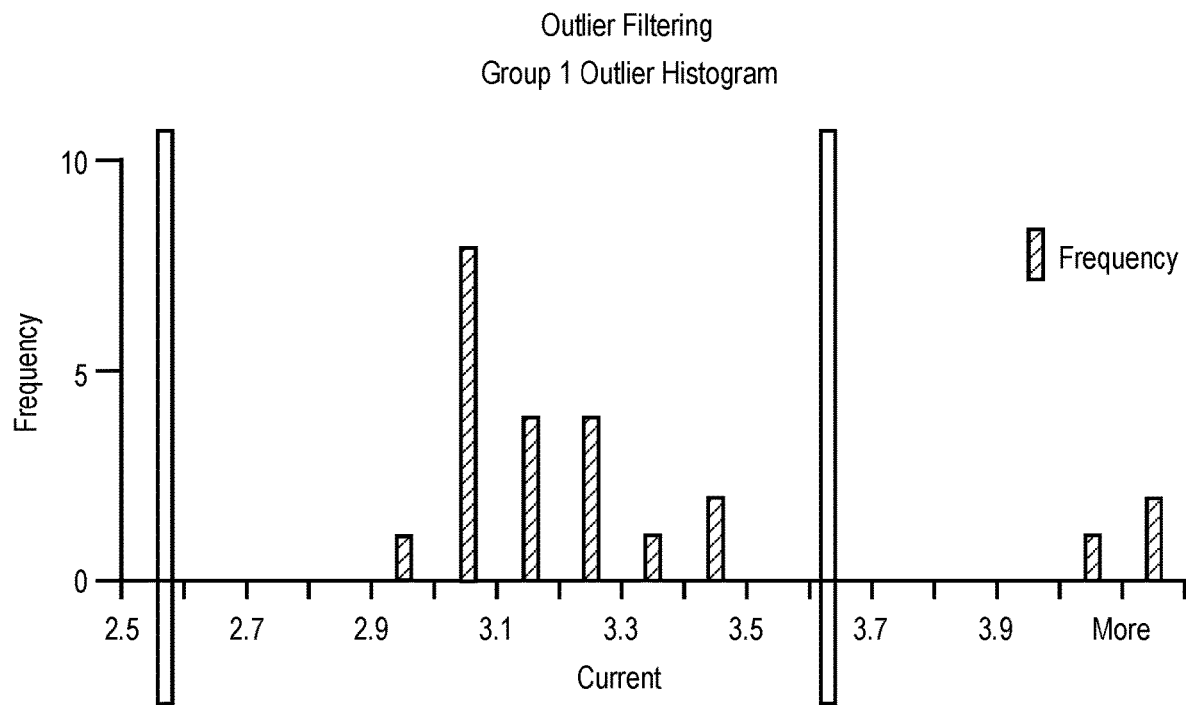
FIGS. 19A and 19B show histograms to illustrate outlier filtering that is carried out in FIG. 16.
Figure 19B:
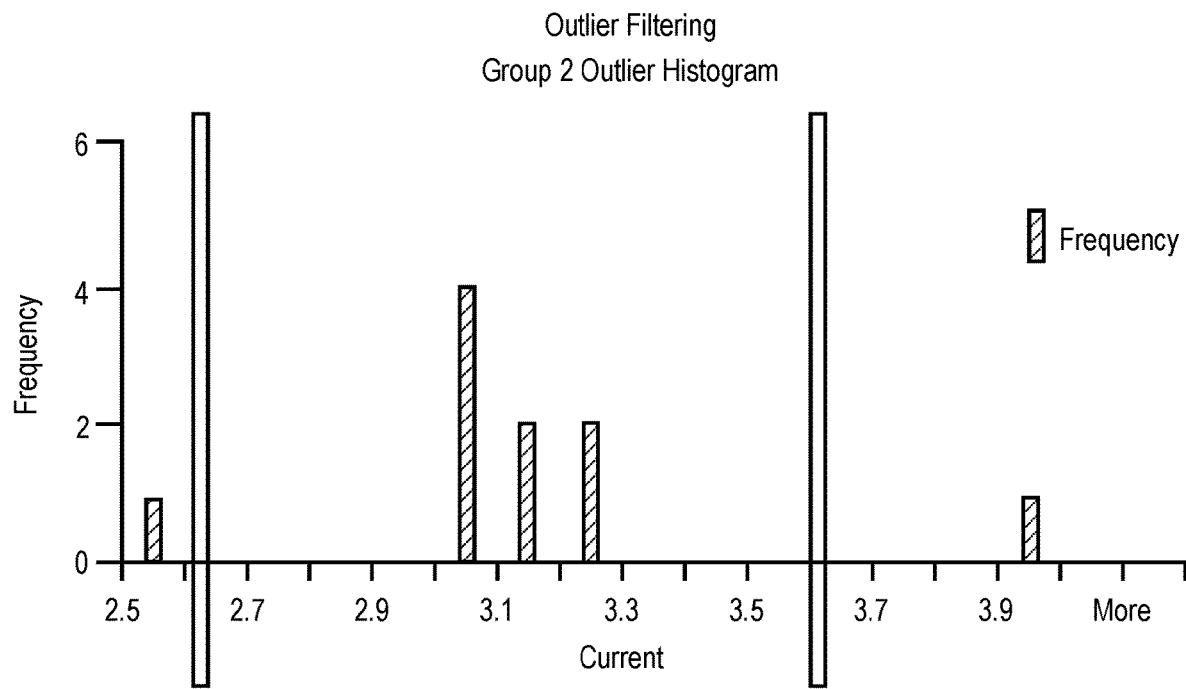

Following static filtering, the data is processed at 714 in FIG. 16 to carry out outlier filtering with the outlier filter 644 in FIG. 15. FIGS. 19A and 19B illustrate outlier filtering in more detail. Outlier filtering removes data too far above and below the median of the data; e.g., +/−20%. Outlier filtering may for example remove a first initial current reading for a respective cluster that is too far above or below a median for the group. Additional filtering can use statistical methods to determine if a first initial current reading of a given channel is abnormal.

Figure 20A:
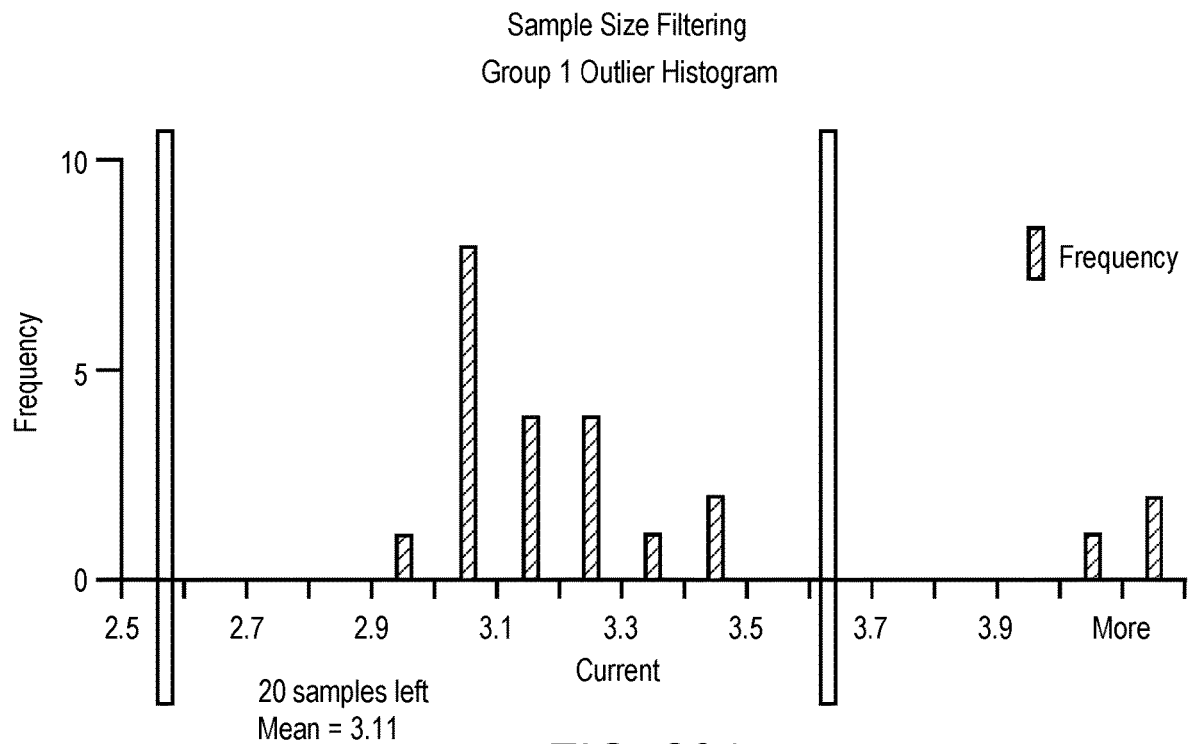
FIGS. 20A and 20B show histograms to illustrate sample size filtering that is carried out in FIG. 16.
Figure 20B:
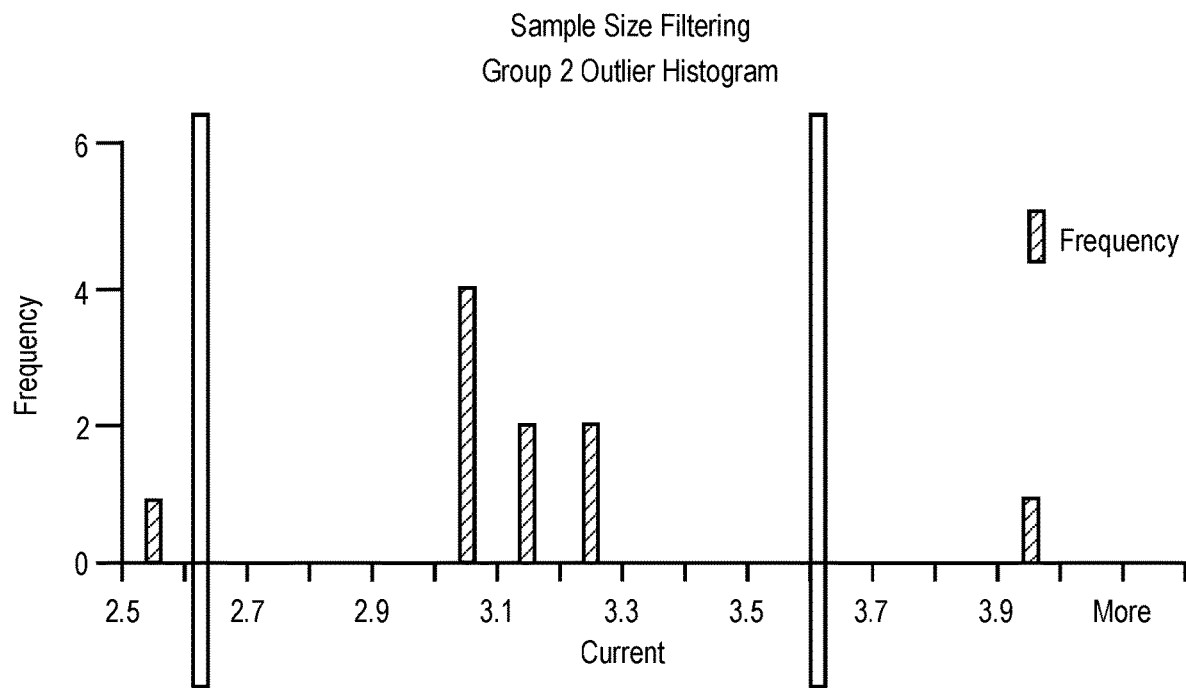

Following outlier filtering, the data is processed at 716 in FIG. 16 to carry out sample size filtering with the sample size filter 646 in FIG. 15. Sample size filtering is illustrated in FIGS. 20A and 20B. Sample size filtering stops computing a mean of the first initial current readings of groups if the number of remaining clusters is too small, e.g., <10. If any group has too few clusters left for proper computations, the mean computation of surrounding groups can be used. Two sample groups are included to show how the filtering would progress. After the outlier filtering, the second group has too few clusters left to give a reliable computation for the voltage. In that case, the average of the other group is used.

At 720 in FIG. 16, a second voltage guess "$V_B$" is made and applied and a resulting second initial current "$I_B$" is measured. The second initial voltage guess is applied in a manner that is the same as the first initial voltage guess at 708. A second initial current is measured for each one of the clusters.

At 722, multi-stage filtering is carried out on the data that includes the second initial currents from the clusters. The multi-stage filtering carried out at 722 is the same as the multi-stage filtering carried out at 710.

FIG. 17 shows the locations of the first and second initial currents after they pass through the multi-stage filtering at 710 and 722. Current measurements are shown on the Y axis and Time is shown on the X axis. A current slope is given by the equation:

$$\text{Slope}=(V_B-V_A)/(I_B-I_A)$$

The slope is thus calculated by dividing the difference between the second and first initial voltages for the electronic devices of the first group by a difference between the second and first initial currents for the electronic devices of the first group.

Steps 708, 712 and 724 that are describe above are executed by the voltage targeting system 648 in FIG. 15. The voltage targeting system 648 controls the voltage adjuster 652 to provide the voltages to the electronic devices of the respective clusters. The voltage targeting system 648 then stores the calculated slope in memory.

Following the computation of the slope at 724 in FIG. 17 and storing of the slope, the voltage targeting system 648 can use the slope to set and retarget test voltages that are applied to each cluster of electronic devices 634. The setting and retargeting of the test voltages is illustrated by steps 726 to 736 in FIG. 16.

At 726, a guess is made for a first test voltage ($V_G$) and a resulting first test current ($I_G$) is measured. It should be understood from the description above and FIG. 15 that the voltage targeting system 648 sets the voltage adjuster 652 so that the voltage source 650 applies the first test voltage to the electronic devices 634 of the first cluster in parallel. It should further be understood that the first test current from the electronic devices 634 of the first cluster that is measured by the current detector 640 is a total current of the electronic device 634 of the first cluster in parallel.

The second and third clusters of the first group receive similar treatment. Each additional cluster thus has a respective first test voltage that is applied to the devices of the cluster and has a first test current that is measured from the devices.

Following the measurement of the first test currents from the clusters, the data of the first test currents again proceed through multi-stage filtering 730. The multi-stage filtering 730 is carried out on the first test currents in a manner similar to the multi-stage filtering 710 that was carried out on the first initial currents from the clusters and the multi-stage filtering 722 that was carried out on the second initial currents from the clusters of the first group.

At 732, a first comparison is made between the first test current and a target current. Specifically, the measured first test current is subtracted from the target current. The difference is recorded as the amount of current error that has to be corrected for. FIG. 17 shows the first initial current as a result of the first initial guess ("G"), the target current ($I_T$) and the current error ($I_T - I_G$).

At 734 in FIG. 16, retargeting is carried out. A second test voltage is computed and the first test voltage is adjusted to the second test voltage. As shown in FIG. 17, the second test voltage is calculated according to the formula:

$$V_G + (I_T - I_G)*\text{Slope}$$

The first comparison at 732 thus forms a basis for the voltage adjustment at 734.

736 in FIG. 16 indicates that the process starting at 726 can be repeated by using the retargeted voltage as the first test voltage and then measuring a test current and calculating a retargeted voltage.

The dashed lined from 702 to 706 in FIG. 16 indicate that the second and third groups of clusters receive similar treatment to the first group of clusters. In the given example, the voltage source 650 provides a voltage through the voltage adjuster 654 to the electronic devices of the second group. The voltages applied to the electronic devices of the first and second groups can be independently controlled in the manner described above. In a similar manner, a separate voltage adjuster provides a voltage to the electronic devices of a separate group. Although only a single current detector 640 is shown, it should be understood that multiple current detectors can be included in the system to detect currents from one or more clusters in one or more groups.

As noted above, parallel wiring with a voltage source has distinct economic advantages. In addition, the voltage retargeting process, as described above, ensures that accurate voltages are applied to devices that are connected using parallel wiring with a voltage source to ensure that the devices receive the correct currents according to their specification.

The clusters can be chosen to match wafer processing (or other) factors that might affect the voltage/current relationship.

It is not uncommon that devices near the edge of the wafer will have characteristics different from devices from near the center of the wafer.

Clusters can be chosen such that edge device are analyzed with other edge devices and center devices are analyzed with other center devices.

The retargeting process is highly convergent and not sensitive to slight errors.

For example, assume the initial voltage/current computation was performed poorly and the resulting slope was off by 20%.

Assume for the first retargeting step that the computed voltage was wrong by 50% (i.e., the current was wrong by 50%.)

The first retargeting would attempt to correct the 50% current error with a slope that has a 20% error. The net correct would then be wrong by 10% (50%*20%).

The next retargeting step would then correct this 10% error and again miscompute by 20%. This correction would wrong by only 2% (10%*20%).

Thus after only 2 retargeting steps, with a starting error of 50% and a slope error of 20%, the resulting current is now within 2%.

This illustrates the rapid convergence this retargeting algorithm. More typically, the slope will be computed within about 5% and the initial current will be within 20%. Then only a single step is required to be within 1% of the correct current.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A cartridge comprising:
  a socket made of an insulative material and having upper and lower sides, the upper side having a first formation for releasably holding a first electronic device, the socket having a first socket thermal opening formed from the lower side to the upper side through the socket;
  an interface connected to the socket to connect the first electronic device to an electric tester;
  a chuck made of a thermally conductive material; and
  a first thermal post attached to the chuck, the first thermal post being inserted into the first socket thermal opening, an end of the first thermal post being thermally connected to the first electronic device, such that heat transfers primarily through the first thermal post as opposed to the insulative material of the socket between the chuck and the first electronic device.

2. The cartridge of claim 1, wherein the upper side has a second formation for releasably holding a second electronic device, the socket having a second socket thermal opening formed from the lower side to the upper side through the socket, the interface connecting the second device to the electric tester, further comprising:
  a second thermal post attached to the chuck, the second thermal post being inserted into the second socket thermal opening, an end of the second thermal post being thermally connected to the second device, such that heat transfers primarily through the second thermal post as opposed to the insulative material of the socket between the chuck and the first electronic device.

3. The cartridge of claim 1, further comprising:
a circuit board between the socket and the chuck, the interface being located on the circuit board, the circuit board having a first circuit board thermal opening through which the thermal post is inserted.

4. The cartridge of claim 3, further comprising:
a first set of contacts held in the socket and connecting terminals of the first electronic device to the circuit board, the first set of contacts being resiliently depressible to bring the first electronic device into contact with the end forming a first thermal surface of the first thermal post.

5. The cartridge of claim 4, further comprising:
a plurality of pins that are mounted to the socket and extend through the socket to connect the first electronic device to the circuit board.

6. The cartridge of claim 1, further comprising:
a lid that is movable relative to the socket to depress the first set of pins to bring the first electronic device into contact with the end of the first thermal post.

7. The cartridge of claim 1, further comprising:
a first thermal anchor, the first thermal post extending from the first thermal anchor, the first thermal anchor having a surface contacting the chuck.

8. The cartridge of claim 6, wherein the first thermal anchor has a larger cross section than the first thermal post in respective planes that are parallel to an axis to the first thermal post, to improve thermal conductivity between the first thermal anchor and the chuck.

9. The cartridge of claim 7, wherein the first thermal anchor is inserted into an opening in an upper surface of the chuck.

10. The cartridge of claim 6, wherein the first thermal anchor is press fit to a select depth into the opening in the upper surface of the chuck.

11. The cartridge of claim 10, wherein the thermal post fits loosely within the first socket thermal opening.

12. A test piece comprising:
a socket made of an insulative material and having upper and lower sides, the upper side having a formation for releasably holding an electronic device, the socket having a socket thermal opening formed from the lower side to the upper side through the socket, a thermally conductive post being insertable from the lower side into the first socket thermal opening;
a set of pins held in the socket and connecting the device to the circuit board, the set of pins being resiliently depressible; and
a lid that is movable relative to the socket to depress the set of pins to bring the electronic device into contact with an end of the first thermally conductive post.

13. A test piece comprising:
a socket made of an insulative material and having a socket thermal opening formed from a lower side to an upper side through the socket, the upper side having a formation for releasable holding an electronic device;
a chuck made of a thermally conductive material; and
a thermal post attached to the chuck, the thermal post being insertable into the socket thermal opening with an end of the thermal post being thermally connected to the first device, such that heat transfers primarily through the thermal post as opposed to an insulative material of the socket between the chuck and the electronic device.

14. A method of testing one or more electronic devices comprising:
releasably holding an electronic device in a first formation of an upper side of a socket made of an insulative material;
connecting the electronic device to an electric tester through an interface connected to the socket;
inserting a thermally conductive post attached to a chuck made of a thermally conductive material into a first socket thermal opening formed from a lower side to the upper side through the socket, an end of the first thermal post being thermally connected to the electronic device; and
transferring heat between the chuck and the first electronic device, the heat transferring primarily through the thermally conductive post as opposed to the insulative material of the socket.

* * * * *